US012751220B2

United States Patent

(12) United States Patent
Kaneko et al.

(10) Patent No.: US 12,751,220 B2
(45) Date of Patent: Sep. 29, 2026

(54) CRYSTALLINE OXIDE FILM AND SEMICONDUCTOR DEVICE

(71) Applicants: FLOSFIA INC., Kyoto (JP); KYOTO UNIVERSITY, Kyoto (JP)

(72) Inventors: Kentaro Kaneko, Kyoto (JP); Hitoshi Takane, Kyoto (JP); Toshimi Hitora, Kyoto (JP)

(73) Assignees: FLOSFIA INC., Kyoto (JP); KYOTO UNIVERSITY, Kyoto (JP)

( * ) Notice: Subject to any disclaimer, the term of this patent is extended or adjusted under 35 U.S.C. 154(b) by 431 days.

(21) Appl. No.: 18/425,922

(22) Filed: Jan. 29, 2024

(65) Prior Publication Data

US 2024/0170285 A1 May 23, 2024

Related U.S. Application Data

(63) Continuation-in-part of application No. PCT/JP2022/028852, filed on Jul. 26, 2022.

(30) Foreign Application Priority Data

Jul. 30, 2021 (JP) ................................ 2021-126327

(51) Int. Cl.
*H10P 14/20* (2026.01)
*H10D 62/40* (2025.01)

(52) U.S. Cl.
CPC ....... *H10P 14/3434* (2026.01); *H10D 62/405* (2025.01); *H10P 14/3458* (2026.01); *H10P 14/3466* (2026.01)

(58) Field of Classification Search
CPC ............ H10P 14/3434; H10P 14/3458; H10P 14/3466; H10P 14/24; H10P 14/265; H10P 14/2921; H10P 14/3442; H10P 14/3444; H10P 14/3456; H10P 14/60; H10D 62/405; H10D 8/60; H10D 12/441; H10D 30/475; H10D 30/635; H10D 30/668; H10D 64/513; H10D 62/80; H10D 62/82; H10D 62/106; H10F 30/227; H10H 20/833
See application file for complete search history.

(56) References Cited

U.S. PATENT DOCUMENTS

| | | | |
|---|---|---|---|
| 6,475,813 | B1 | 11/2002 | Li et al. |
| 2002/0018904 | A1 | 2/2002 | Li et al. |
| 2015/0228492 | A1 | 8/2015 | Toriumi et al. |

(Continued)

FOREIGN PATENT DOCUMENTS

| | | |
|---|---|---|
| JP | 53-10990 | 1/1978 |
| JP | 54-2542 | 2/1979 |

(Continued)

OTHER PUBLICATIONS

International Search Report (ISR) issued Sep. 13, 2022 in International (PCT) Application No. PCT/JP2022/028852.

(Continued)

*Primary Examiner* — Andrew J. Oyer
(74) *Attorney, Agent, or Firm* — Wenderoth, Lind & Ponack, L.L.P.

(57) ABSTRACT

Provided is a crystalline oxide film including an oxide of germanium, an area percentage of abnormal grains determined by surface SEM observation being 3% or less.

10 Claims, 20 Drawing Sheets

RMS : $1.378 \times 10^{-1}$ nm

(56) References Cited

U.S. PATENT DOCUMENTS

| | | | | |
|---|---|---|---|---|
| 2015/0325659 | A1* | 11/2015 | Hitora | H10D 62/86<br>257/43 |
| 2017/0200790 | A1* | 7/2017 | Hitora | H10D 62/80 |
| 2017/0278706 | A1* | 9/2017 | Oda | H10P 14/3434 |
| 2020/0144376 | A1* | 5/2020 | Hitora | H10D 62/80 |
| 2021/0119000 | A1* | 4/2021 | Hitora | H10D 62/80 |

FOREIGN PATENT DOCUMENTS

| | | |
|---|---|---|
| JP | 2000-12860 | 1/2000 |
| JP | 2001-7104 | 1/2001 |
| JP | 2003-86587 | 3/2003 |
| JP | 2016-146382 | 8/2016 |
| WO | 2014/030389 | 2/2014 |
| WO | 2014/050187 | 4/2014 |

OTHER PUBLICATIONS

M. Stapelbroek et al., "Exciton Structure in the U.V.—Absorption Edge of Tetragonal $Ge0_2$", Solid State Communications, vol. 25, pp. 959-962, 1978.

K. Bushick et al., "Electron and hole mobility of rutile $GeO_2$ from first principles: an ultrawide-band-gap semiconductor for power electronics", Applied Physics Letters, 117.18: 182104, pp. 1-24, 2020.

S. Chae et al., "Epitaxial stabilization of rutile germanium oxide thin film by molecular beam epitaxy", Applied Physics Letters, 117.7: 072105, pp. 1-6, 2020.

F. Liu et al., "Hybrid Molecular Beam Epitaxy of Ge-based Oxides", Bulletin of the American Physical Society, pp. 1-24, 2021.

* cited by examiner

RMS : $1.378 \times 10^{-1}$ nm

CRYSTALLINE OXIDE FILM AND SEMICONDUCTOR DEVICE

CROSS REFERENCE TO RELATED APPLICATION

This application is a continuation-in-part application of International Patent Application No. PCT/JP2022/028852 (Filed on Jul. 26, 2022), which claims the benefit of priority from Japanese Patent Application No. 2021-126327 (filed on Jul. 30, 2021).

The entire contents of the above applications, which the present application is based on, are incorporated herein by reference.

1. FIELD OF THE INVENTION

The present disclosure relates to a crystalline oxide film that is useful in a semiconductor device, and a semiconductor device using the crystalline oxide film.

2. DESCRIPTION OF THE RELATED ART

Germanium oxide is of interest for use as a wide band gap semiconductor that is useful in a power device or the like. Germanium oxide has a reported band gap of from 4.44 eV to 4.68 eV and has a first-principles predicted Hall mobility of 27 $cm^2/Vs$ (in a direction perpendicular to a c-axis) or 29 $cm^2/Vs$. Thus, use in a p-n homojunction is expected.

Research is also being conducted on actually creating germanium oxide, rather than just making predictions such as those above. For example, one known technique is using an MBE method to form a film of germanium oxide on an R-plane sapphire substrate via an $(Sn,Ge)O_2$ buffer layer. Forming a $(Sn,Ge)O_2$ film having a rutile-type structure on a $(001)TiO_2$ substrate using a hybrid MBE method is also known.

SUMMARY OF THE INVENTION

According to an example of the present disclosure, there is provided a crystalline oxide film including an oxide of germanium, an area percentage of abnormal grains determined by surface SEM observation being 3% or less.

Thus, a crystalline oxide film according to the present disclosure has reduced abnormal grains and good crystallinity.

DETAILED DESCRIPTION

Figure 1:
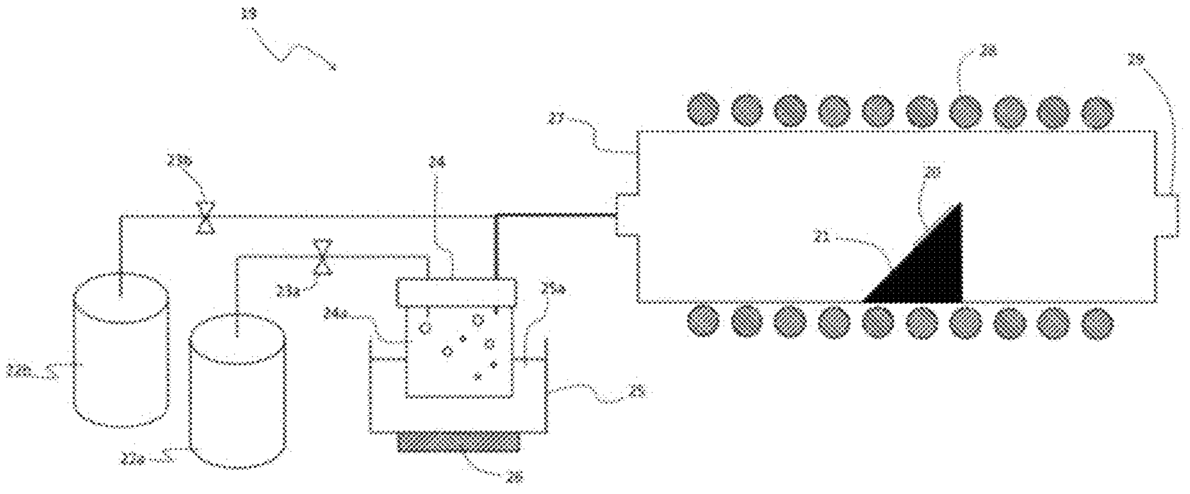
FIG. 1 is a schematic configuration diagram of a film forming device suitably used in an embodiment of the present disclosure.

The present inventors researched diligently and were successful for the first time in the world in fabricating, by creating geranium oxide on a tetragonal crystal substrate under specific conditions using a mist CVD method, a crystalline oxide film containing an oxide of germanium, in which an area percentage of abnormal grains determined by surface SEM observation is 3% or less. The present inventors also found that such a crystalline oxide film may solve the related art problem mentioned above.

Embodiments of the present disclosure will be described below with reference to the accompanying drawings. In the following description, the same parts and components are designated by the same reference numerals. The present embodiment includes, for example, the following disclosures.

[Structure 1]

A crystalline oxide film including an oxide of germanium, an area percentage of abnormal grains determined by surface SEM observation being 3% or less.

[Structure 2]

The crystalline oxide film according to [Structure 1], wherein the crystalline oxide film has a film thickness of 100 nm or more.

[Structure 3]

The crystalline oxide film according to [Structure 1] or [Structure 2], wherein a region in which the area percentage of the abnormal grains determined by surface SEM observation is 3% or less exists over an area of at least 0.04 $mm^2$.

[Structure 4]

The crystalline oxide film according to any one of [Structure 1] to [Structure 3], wherein the crystalline oxide film has a surface roughness of 10 nm or less.

[Structure 5]

The crystalline oxide film according to any one of [Structure 1] to [Structure 4], wherein the crystalline oxide film has a tetragonal crystal structure.

[Structure 6]

The crystalline oxide film according to any one of [Structure 1] to [Structure 5], wherein the crystalline oxide film is a uniaxially oriented film.

[Structure 7]

The crystalline oxide film according to any one of [Structure 1] to [Structure 6], wherein the crystalline oxide film has a full width at half maximum determined by X-ray diffraction measurement of 1000 arcsec or less.

[Structure 8]

A semiconductor device including at least a crystalline oxide film and an electrode, the crystalline oxide film being the crystalline oxide film described in any one of [Structure 1] to [Structure 7].

[Structure 9]

A power conversion device using the semiconductor device described in [Structure 8].

[Structure 10]

A control system using the semiconductor device described in [Structure 8].

A crystalline oxide film according to the present disclosure is a crystalline oxide film containing an oxide of germanium, in which an area percentage of abnormal grains determined by surface scanning electron microscope (SEM) observation is 3% or less. In an embodiment of the present disclosure, the area percentage of the abnormal grains is preferably 1% or less. The term "abnormal grains" herein refers to grains observed as a region having a different height from its surroundings by surface SEM observation. The area percentage of the abnormal grains is calculated as the area percentage of a region having a different height to a flat portion, relative to the total area of the observed region, by surface SEM observation over an area of at least 100 μm square. In an embodiment of the present disclosure, a region in which the area percentage of the abnormal grains determined by surface SEM observation is 3% or less preferably exists over an area of at least 0.04 $mm^2$. In the crystalline oxide film, an atomic ratio of germanium in a metal element in the film is preferably greater than 0.5. The crystal structure of the crystalline oxide film is also not particularly limited. Examples of the crystal structure of the crystalline oxide film include a hexagonal crystal structure and a tetragonal crystal structure. In an embodiment of the present disclosure, the crystalline oxide film preferably has a tetragonal crystal structure, and more preferably has a rutile-type structure. The crystalline oxide film may be composed of a single crystal or may be composed of many crystals. In an embodiment of the present disclosure, the crystalline oxide film is preferably a single crystal.

In an embodiment of the present disclosure, the crystalline oxide film is also preferably a uniaxially oriented film, and is preferably oriented to a crystallographic axis direction perpendicular or parallel to the c-axis. The term "c-axis" herein refers to an axis perpendicular to the (001) plane in a tetragonal system. Additionally, the phrase "crystallographic axis direction perpendicular to the c-axis" also includes a crystallographic axis substantially perpendicular to the c-axis (within ±10% of a direction perpendicular to the c-axis). The phrase "crystallographic axis direction parallel to the c-axis" also includes a crystallographic axis direction substantially parallel to the c-axis (within ±10% of a direction parallel to the c-axis). In the present disclosure, the crystalline oxide film is preferably oriented in a crystallographic axis direction parallel to the c-axis and preferably oriented to the c-axis direction. Note that, the term "oriented" refers to a state in which the crystal faces represented by the (001) plane, for example, are aligned in a particular direction. The state of orientation may be confirmed by X-ray diffraction. More specifically, in a case where the crystalline oxide film is oriented to the (001) plane, for example, it may be determined that the crystalline oxide film is oriented to the (001) plane when the ratio of the integrated intensity ratio of peaks derived from the (001) plane to peaks derived from other crystal planes is greater than the ratio of the integrated intensity ratio of peaks derived from the (001) plane to peaks derived from other crystal planes in the same randomly oriented crystal. Additionally, in an embodiment of the present disclosure, the rocking curve full width at half maximum determined by X-ray diffraction measurement in the crystallographic axis direction of orientation as described above is preferably 1000 arcsec or less, more preferably 600 arcsec or less.

The film thickness of the crystalline oxide film is not particularly limited. In an embodiment of the present disclosure, the film thickness is preferably 100 nm or more, more preferably 200 nm or more. Additionally, in an embodiment of the present disclosure, a surface roughness (RMS) of the crystalline oxide film is preferably 10 nm or less, more preferably 1 nm or less. By setting such a preferred film thickness or surface roughness, the semiconductor device may be provided with better breakdown voltage resistance when the crystalline oxide film is applied to the semiconductor device. Note that, the surface roughness (RMS) is a value obtained by performing a calculation using the surface profile measurement results for a region of 10 μm square by an atomic force microscope (AFM) in accordance with JIS B0601 and using the obtained value.

In an embodiment of the present disclosure, the crystalline oxide film preferably contains an oxide of germanium having a rutile-type structure. In an embodiment of the present disclosure, the crystalline oxide film more preferably contains the oxide of germanium as a major component. Note that, the term "major component" here means that the amount of the oxide of germanium (germanium oxide) in the crystalline oxide film is 50% or more in terms of the composition ratio in the crystalline oxide film. In an embodiment of the present disclosure, the content of the oxide of germanium in the crystalline oxide film is preferably 70% or more, more preferably 90% or more in terms of the composition ratio in the crystalline oxide film. The oxide of germanium is not particularly limited provided that the oxide is a compound of oxygen and germanium. Additionally, the crystalline oxide film may include another metal other than germanium. An example of the other metal is a Group 14 metal other than germanium (e.g., tin or silicon). The atomic ratio of germanium in a metal element in the crystalline oxide film is not particularly limited provided that the atomic ratio is greater than 0.5. In an embodiment of the present disclosure, the atomic ratio of germanium in a metal element in the crystalline oxide film is preferably 0.7 or more, more preferably 0.9 or more. With germanium in the above preferable range, a crystalline oxide film having a higher band gap (e.g., 4.0 eV or more, more preferably 4.4 eV or more) may be achieved.

The crystalline oxide film also preferably contains a dopant. The dopant is not particularly limited unless it interferes with the present disclosure. The dopant may be an n type dopant or a p type dopant. Examples of the n type dopant include antimony (Sb), arsenic (As), bismuth (Bi), and fluorine (F). In an embodiment of the present disclosure, the n type dopant is preferably antimony (Sb). Examples of the p type dopant include aluminum (Al), gallium (Ga), and indium (In). The amount of the dopant in the crystalline oxide film is not particularly limited unless it interferes with the present disclosure. Specifically, the amount of the dopant in the crystalline oxide film may be approximately $1\times10^{16}/cm^3$ to $1\times10^{22}/cm^3$ and, according to the present disclosure, the dopant may be provided in a high concentration of approximately $1\times10^{20}/cm^3$ or more.

(Crystal Substrate)

The crystal substrate is not particularly limited unless it interferes with the present disclosure, and a known substrate may be used. The crystal substrate may be an insulator substrate, a conductive substrate, or a semiconductor substrate. The crystal substrate may be a single crystal substrate or a polycrystalline substrate. A front surface of the crystal substrate may include a metal film. Note that, in a case where the crystal substrate is a conductive substrate, a vertical device may be fabricated without removing the substrate. The crystal structure of the crystal substrate is also not particularly limited unless it interferes with the present disclosure. Examples of the crystal structure of the crystal substrate include a hexagonal crystal structure and a tetragonal crystal structure. An example of a crystal substrate with a corundum structure is a sapphire substrate (e.g., an R-face sapphire substrate). Examples of a crystal substrate with a tetragonal crystal structure include a $SrTiO_3$ substrate, a $TiO_2$ substrate, and an $MgF_2$ substrate. In an embodiment of the present disclosure, the crystal substrate preferably has a tetragonal crystal structure, and more preferably has a rutile-type structure. An example of a crystal substrate having a rutile-type structure is a rutile-type titanium dioxide (r-$TiO_2$) substrate. An r-$TiO_2$ substrate is preferably a conductive substrate containing a dopant such as Nb. Note that, the crystal substrate may have an off-angle. Additionally, in an embodiment of the present disclosure, a Ge substrate is preferably used as the crystal substrate.

The crystalline oxide film may be obtained by, for example, the following suitable film forming method. This manufacturing method of a crystalline oxide film (hereinafter also referred to as "oxide semiconductor" or "oxide crystal") is also novel and useful and is incorporated as one aspect of the present disclosure.

In the manufacturing method of an oxide semiconductor according to the present disclosure, for example, a raw material solution containing germanium is atomized or formed into droplets (atomization step), a carrier gas is supplied to the obtained atomized droplets, the atomized droplets are carried onto a crystal substrate having a tetragonal crystal structure by the carrier gas (carrying step) and, simultaneously, the atomized droplets are caused to thermally react on the crystal substrate (film forming step).

<Base>

The base is not particularly limited provided that the base supports the oxide semiconductor. The material of the base is also not particularly limited unless it interferes with the present disclosure, and a known base may be used. The base may be made of an organic compound or an inorganic compound. Additionally, the shape of the base is not particularly limited unless it interferes with the present disclosure. Examples of the shape of the base include a plate shape, such as a flat plate or a disc, a fibrous shape, a rod shape, a cylindrical shape, a polygonal shape, a tubular shape, a spiral shape, a spherical shape, and a ring shape. In the present disclosure, the base is preferably a substrate, more preferably a crystal substrate. The thickness of the substrate is not particularly limited. Additionally, the crystal substrate may be the same as the crystal substrate described above.

(Atomization Step)

In the atomization step, the raw material solution is atomized. The atomization method is not limited as long as the raw material solution is atomized, and any known method may be used. In the present disclosure, an atomization method using ultrasonic waves is preferred. A mist obtained by using ultrasonic waves is desirable because the mist has an initial velocity of zero and is suspended in the air. The mist obtained by using ultrasonic waves is also very suitable because it is transported as a gas suspended in space rather than being sprayed, so there is no damage caused by collision energy, for example. The size of the mist droplets is not particularly limited and may be several millimeters, but is preferably less than 50 μm, and more preferably 100 nm to 10 μm.

(Raw Material Solution)

The raw material solution may contain a dopant element and germanium, as long as the content of the germanium is greater than the content of the dopant element. The raw material solution may contain an inorganic material or an organic material. In an embodiment of the present disclosure, the raw material solution preferably contains germanium in the form of an organic germanium compound. Additionally, in an embodiment of the present disclosure, the organic germanium compound preferably has a carboxy group. The ratio of germanium (e.g., the organic germanium compound) in the raw material solution is not particularly limited, but 0.0001 mol/L to 20 mol/L is preferably used, and 0.001 mol/L to 1.0 mol/L is more preferably used, with respect to the entire raw material solution. Note that the raw material solution may contain another metal (e.g., tin or silicon) other than geranium.

The raw material solution may contain a dopant element. Examples of the dopant element include antimony (Sb), arsenic (As), bismuth (Bi), fluorine (F), aluminum (Al), gallium (Ga), or indium (In). In the embodiment of the present disclosure, the dopant element is preferably antimony (Sb). Note that, the dopant element may be contained in the raw material solution in the form of an inorganic compound or in the form of an organic compound.

The solvent of the raw material solution is not particularly limited and may be an inorganic solvent such as water, an organic solvent such as alcohol, or a mixed solution of an inorganic solvent and an organic solvent. In the present disclosure, the solvent preferably contains water, and is also preferably a mixed solvent of water and an acid. More specifically, examples of the water include pure water, ultrapure water, tap water, well water, mineral spring water, mineral water, hot spring water, spring water, fresh water, and seawater. In the present disclosure, ultrapure water is preferably used. Further, examples of the acid include organic acids such as acetic acid, propionic acid, and butanoic acid, boron trifluoride, boron trifluoride etherate, boron trichloride, boron tribromide, trifluoroacetic acid, trifluoromethanesulfonic acid, and p-toluenesulfonic acid.

An additive such as a hydrohalogenated acid or an oxidizing agent may be mixed into the raw material solution. Examples of the hydrohalogenated acid include hydrobromic acid, hydrochloric acid, and hydroiodic acid. Examples of the oxidizing agent include peroxides such as hydrogen peroxide ($H_2O_2$), sodium peroxide ($Na_2O_2$), barium peroxide ($BaO_2$), benzoyl peroxide $(C_6H_5CO)_2O_2$, hypochlorous acid (HClO), and organic peroxides such as perchloric acid, nitric acid, ozone water, peracetic acid, and nitrobenzene.

(Carrying Step)

In the carrying step, a carrier gas is supplied to the obtained atomized droplets (hereinafter also simply referred to as "mist"), and the mist is carried onto the base by the carrier gas. The type of carrier gas is not particularly limited unless it interferes with the present disclosure. For example, an inert gas such as oxygen, ozone, nitrogen or argon, or a reducing gas such as hydrogen gas or forming gas may be used. In the present disclosure, oxygen is preferably used as the carrier gas. Air, oxygen gas, and ozone gas are examples of a carrier gas in which oxygen is used, and oxygen and/or ozone gas is especially preferably used. One type of carrier gas may be used, or two or more types of carrier gas may be used, and a diluted gas having a varied carrier gas concentration (e.g., gas diluted by 10 times) may be further used as a second carrier gas. The carrier gas may be supplied not only to one location but also to two or more locations. In the present disclosure, when an atomization chamber, a feed tube, and a film forming chamber are used, a supply location for the carrier gas is preferably provided in the atomization chamber and in the feed tube, respectively. More preferably, a supply location for the carrier gas is provided in the atomization chamber and a supply location for the diluted gas in provided in the feed tube. Further, the flow rate of the carrier gas is not particularly limited but is preferably 0.01 to 20 L/min, more preferably 1 to 10 L/min. In the case of diluted gas, the flow rate of the dilution gas is preferably 0.001 to 2 L/min, more preferably 0.1 to 1 L/min.

(Film Forming Step)

In the film forming step, the atomized droplets are caused to thermally react on the base to form a film on all or some of the surface of the base. The thermal reaction is not particularly limited as long as the thermal reaction forms a film from the mist. The reaction conditions are also not particularly limited unless it interferes with the present disclosure, and the mist need only be caused to react by heat. In this step, the thermal reaction is usually performed at a temperature equal to or greater than the temperature at which the solvent evaporates, and a moderate temperature is preferable. In the present disclosure, the thermal reaction is preferably performed at 700° C. to 800° C. Additionally, unless it interferes with the present disclosure, the thermal reaction may be performed in any atmosphere such as a vacuum, an oxygen-free atmosphere, a reducing gas atmosphere, or an oxidizing atmosphere, and may be performed under any conditions such as under atmospheric pressure, under pressure, or under decompression. In the present disclosure, the thermal reaction is preferably performed in an oxidizing atmosphere, and also preferably performed under atmospheric pressure, more preferably performed in an oxidizing atmosphere under atmospheric pressure. Note that, the term "oxidizing atmosphere" is not particularly limited and may be any atmosphere in which the oxide semiconductor may be formed by the thermal reaction. For example, the oxidizing atmosphere may be created by using a carrier gas containing oxygen or by using a mist consisting of a raw material solution containing an oxidizing agent. Additionally, the thickness of the film may be set by adjusting the film formation time.

In an embodiment of the present disclosure, the film may be formed directly on the base, or another layer such as a layer different to the oxide semiconductor (e.g., an n type semiconductor layer, an n+ type semiconductor layer, or an n− type semiconductor layer), an insulator layer (including a semi-insulator layer), or a barrier layer may be stacked on the base and the film may be formed on the base via the other layer. Particularly, the buffer layer may be suitably used to reduce the difference in lattice constants between the crystal substrate and the crystalline oxide film. Examples of the constituent material of the buffer layer include $SnO_2$, $TiO_2$, $VO_2$, $MnO_2$, $RuO_2$, $CsO_2$, $IrO_2$, $GeO_2$, $CuO_2$, $PbO_2$, $AgO_2$, $CrO_2$, $SiO_2$, and their mixed crystals.

The crystalline oxide film obtained as described above is useful in a semiconductor device, particularly a power semiconductor device, and is suitably used as a semiconductor device including, for example, at least the crystalline oxide film and an electrode. Examples of the semiconductor device formed using the crystalline oxide film include a transistor or TFT such as an MIS or an HEMT, a Schottky barrier diode employing a semiconductor-metal junction, a JBS, a PN or PIN diode combined with another P-layer, and a light-emitting/receiving element. Note that, in the present disclosure, the crystalline oxide film may be suitably used in photoelectric conversion devices, gas sensors, photoelectrodes, and memories, in addition to those listed above. In an embodiment of the present disclosure, the crystalline oxide film may be used in a semiconductor device as the crystalline oxide film by removing the crystal substrate if desired, or may be used in a semiconductor device as a crystalline multilayer structure with the crystal substrate. Particularly, in a case where the crystalline substrate is a conductive substrate, the crystalline oxide film may be suitably applied to a semiconductor device (vertical device) as the crystalline multilayer structure.

The semiconductor device is suitable for both a horizontal-type device in which electrodes are formed on one surface of the semiconductor layer (horizontal device) and a vertical-type device including electrodes on both the front and back surfaces of the semiconductor layer (vertical device). In an embodiment of the present disclosure, the semiconductor device is particularly preferably a vertical device. Suitable examples of the semiconductor device include Schottky barrier diodes (SBDs), junction barrier Schottky diodes (JBSs), metal-semiconductor field-effect transistors (MESFETs), high-electron-mobility transistors (HEMTs), metal-oxide-semiconductor field-effect transistors (MOSFETs, electrostatic induction transistors (SITs), junction field-effect transistors (JFETs), insulated gate bipolar transistors (IGBTs), and light-emitting diodes (LEDs).

Suitable examples of the semiconductor device in which the crystalline oxide film of the present disclosure is applied to an n type semiconductor layer (n+ type semiconductor layer, n− type semiconductor layer, etc.) will be described below with reference to the drawings, but the present disclosure is not limited to these examples.

(SBD)

Figure 6:
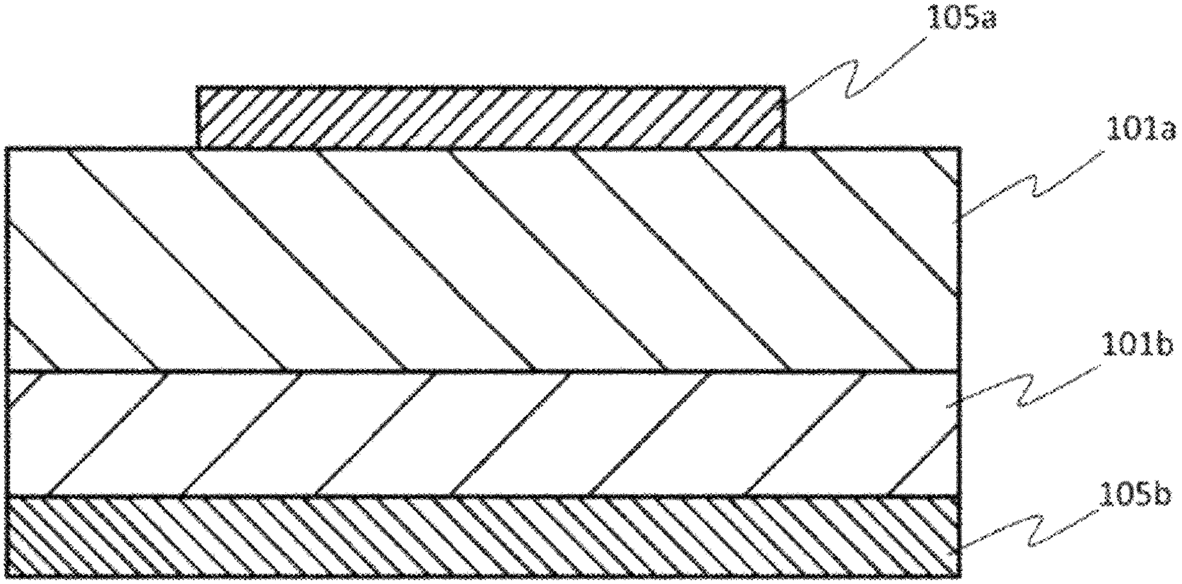
FIG. 6 is a diagram schematically illustrating a suitable example of a Schottky barrier diode (SBD).

FIG. 6 illustrates an example of a Schottky barrier diode (SBD) according to an embodiment of the present disclosure. The SBD in FIG. 6 includes an n− type semiconductor layer 101*a*, an n+ type semiconductor layer 101*b*, a Schottky electrode 105*a*, and an ohmic electrode 105*b*.

The material of the Schottky electrode and the ohmic electrode may be any known electrode material. Examples of the electrode material include a metal such as Al, Mo, Co, Zr, Sn, Nb, Fe, Cr, Ta, Ti, Au, Pt, V, Mn, Ni, Cu, Hf, W, Ir, Zn, In, Pd, Nd or Ag or alloys of these, conductive films made of a metal oxide such as tin oxide, zinc oxide, rhenium oxide, indium oxide, indium tin oxide (ITO), and indium zinc oxide (IZO), organic conductive compounds such as polyaniline, polythiophene or polypyrrole, and mixtures or laminates of these materials.

The Schottky electrode and the ohmic electrode may be formed by a known technique such as vacuum deposition or sputtering. More specifically, for example, in a case where the Schottky electrode is formed using two of the aforementioned metals as a first metal and a second metal, a layer made of the first metal and a layer made of the second metal are stacked, and patterning using a photolithography technique may be performed on the layer made of the first metal and the layer made of the second metal.

When a reverse bias is applied to the SBD in FIG. 6, the depletion layer (not illustrated) extends into the n− type semiconductor layer 101*a*, resulting in a high-voltage SBD. On the other hand, when a forward bias is applied, electrons flow from the ohmic electrode 105*b* to the Schottky electrode 105*a*. In this way, the SBD employing the semiconductor structure described above has excellent high breakdown voltage and high current, a fast switching speed, and excellent breakdown voltage and reliability.

(JBS)

Figure 7:
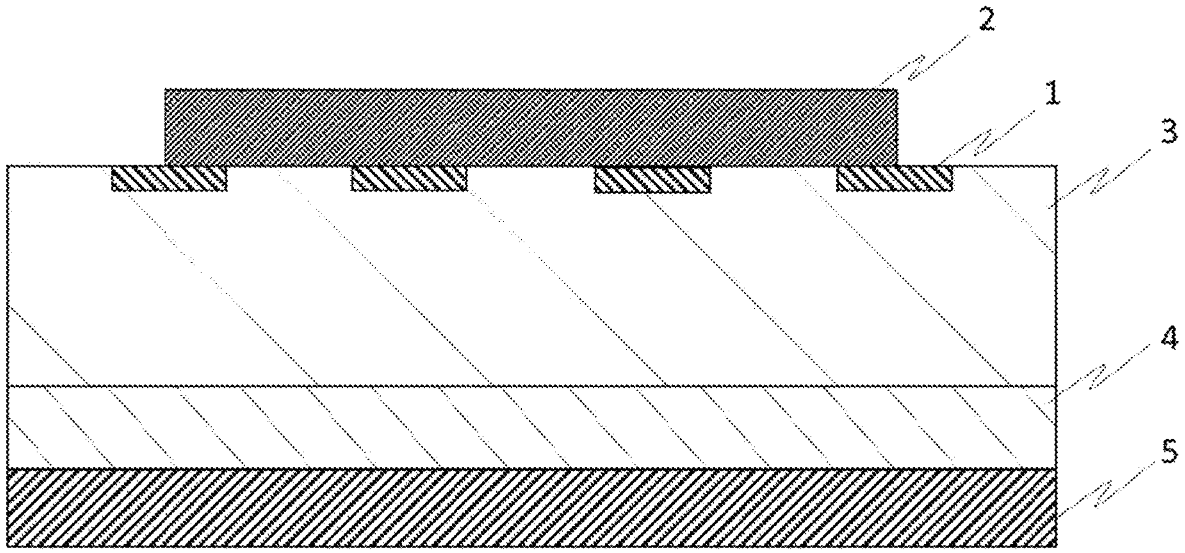
FIG. 7 is a diagram schematically illustrating a suitable example of a junction barrier Schottky diode (JBS).

FIG. 7 illustrates a junction barrier Schottky diode (JBS) as an example of a suitable embodiment of the present disclosure. The semiconductor device in FIG. 7 includes an n+ type semiconductor layer 4, an n− type semiconductor layer 3 stacked on the n+ type semiconductor layer 4, a Schottky electrode 2 provided on the n− type semiconductor layer 3 and that forms a Schottky barrier with the n− type semiconductor layer 3, and a p type semiconductor layer 1 provided between the Schottky electrode 2 and the n− type semiconductor layer 3. Note that, the p type semiconductor layer 1 is preferably buried in the n− type semiconductor layer 3. In the present disclosure, p type semiconductor layers are preferably provided at constant intervals. More preferably, a p type semiconductor layer is provided between both ends of the Schottky electrode and the n− type semiconductor layer, respectively. In this preferred manner, the JBS is configured to have better thermal stability and adhesion, even less leakage current, and better semiconductor characteristics such as breakdown voltage. Note that, the semiconductor device in FIG. 7 includes an ohmic electrode 5 on the n+ type semiconductor layer 4.

The method of forming each layer of the semiconductor device in FIG. 7 is not particularly limited and may be any known method unless it interferes with the present disclosure. For example, a film may be deposited by vacuum deposition, CVD, sputtering, or various coating techniques, and then patterning may be performed by photolithography, or directly by using a printing technique.

(MOSFET)

Figure 8:
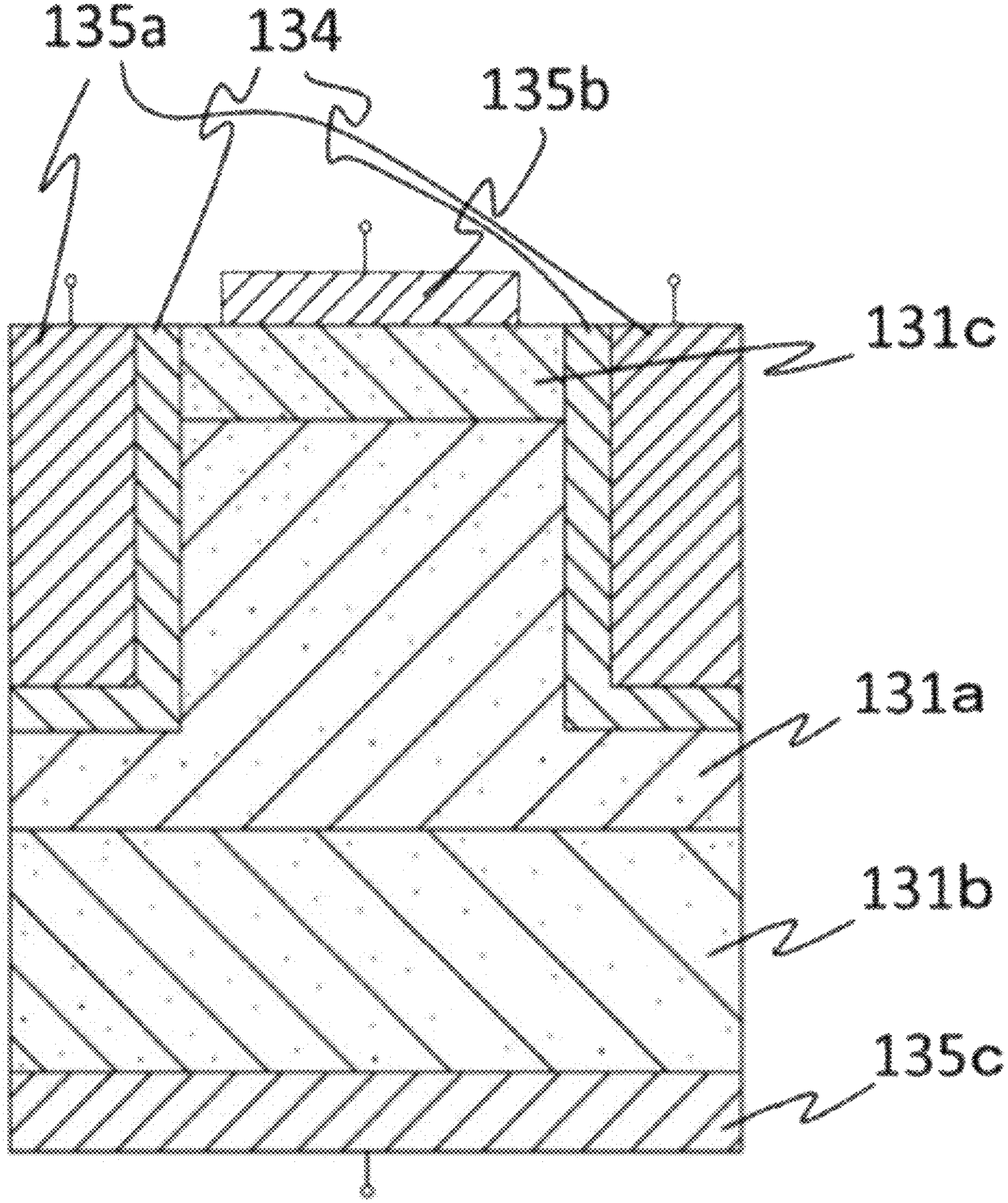
FIG. 8 is a diagram schematically illustrating a suitable example of a metal-oxide-semiconductor field-effect transistor (MOSFET).

An example in which the oxide semiconductor of the present disclosure is a MOSFET is illustrated in FIG. 8. The MOSFET in FIG. 8 is a trench-type MOSFET and includes an n− type semiconductor layer 131*a*, *n*+ type semiconductor layers 131*b* and 131*c*, a gate insulating film 134, a gate electrode 135*a*, a source electrode 135*b*, and a drain electrode 135*c*.

On the drain electrode 135*c*, the n+ type semiconductor layer 131*b* having a thickness of from 100 nm to 100 μm for example, is formed, and on the n+ type semiconductor layer 131*b*, the n− type semiconductor layer 131*a* having a thickness of from 100 nm to 100 μm for example, is formed. Further, the n+ type semiconductor layer 131*c* is formed on the n− type semiconductor layer 131*a*, and the source electrode 135*b* is formed on the n+ type semiconductor layer 131*c*.

Within the n− type semiconductor layer 131*a* and the n+ type semiconductor layer 131*c*, a plurality of trench grooves are formed with a depth that penetrates the n+ type semiconductor layer 131*c* and reaches the middle of the n− type semiconductor layer 131*a*. The gate electrode 135*a* is formed embedded in the trench grooves via the gate insulating film 134 with a thickness of, for example, 10 nm to 1 μm.

In the on state of the MOSFET in FIG. 8, when a voltage is applied between the source electrode 135*b* and the drain electrode 135*c* and a positive voltage is applied to the gate electrode 135*a* with respect to the source electrode 135*b*, a channel layer is formed on a side surface of the n− type semiconductor layer 131*a*, and electrons are injected into the n− type semiconductor layer 131*a* to turn the MOSFET on. In the off state, the voltage of the gate electrode 135*a* is set to 0 V, the channel layer disappears, and the n− type semiconductor layer 131*a* is filled with a depletion layer, resulting in the MOSFET turning off.

(HEMT)

Figure 16:
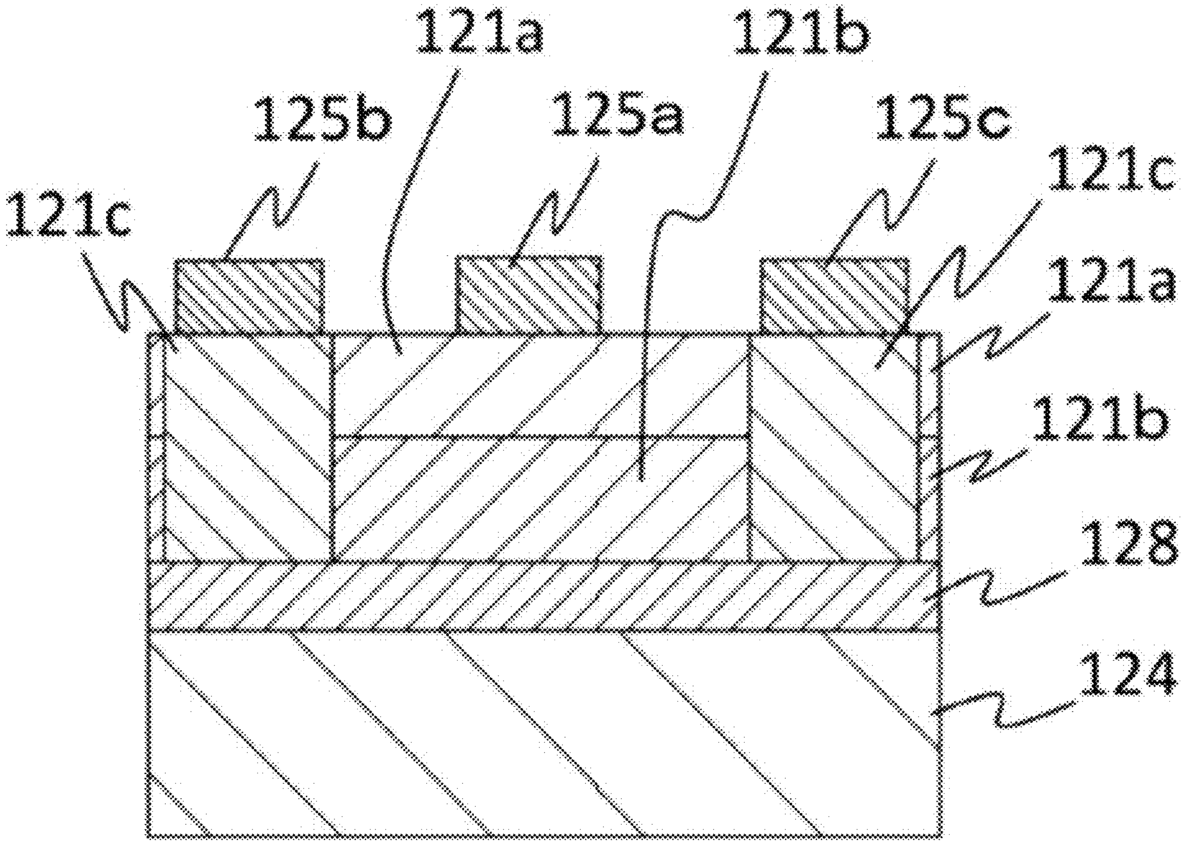
FIG. 16 is a diagram schematically illustrating a suitable example of a high-electron-mobility transistor (HEMT).

FIG. 16 illustrates an example of a high-electron-mobility transistor (HEMT) according to an embodiment of the present disclosure. The HEMT in FIG. 16 includes an n type semiconductor layer 121 a having a wide band gap, an n type semiconductor layer 121*b* having a narrow band gap, an n+ type semiconductor layer 121*c*, a semi-insulator layer 124, a buffer layer 128, a gate electrode 125*a*, a source electrode 125*b*, and a drain electrode 125*c*. In an embodiment of the present disclosure, for example, the crystalline oxide film is used for the n type semiconductor layer 121*a* having a wide band gap and Ge is used for the n type semiconductor layer 121*b* having a narrow band gap.

In the above-described example, a p type semiconductor is not used. However, in an embodiment of the present disclosure, no limitation is intended and a p type semiconductor may be used. Examples in which a p type semiconductor is used are illustrated in FIGS. 9 to 11 and FIGS. 17 to 20. These semiconductor devices may be manufactured in the same way as the above-described example. Note that, the p type semiconductor is preferably made of the same material as the n type semiconductor and preferably includes a p type dopant.

(MOSFET)

Figure 9:
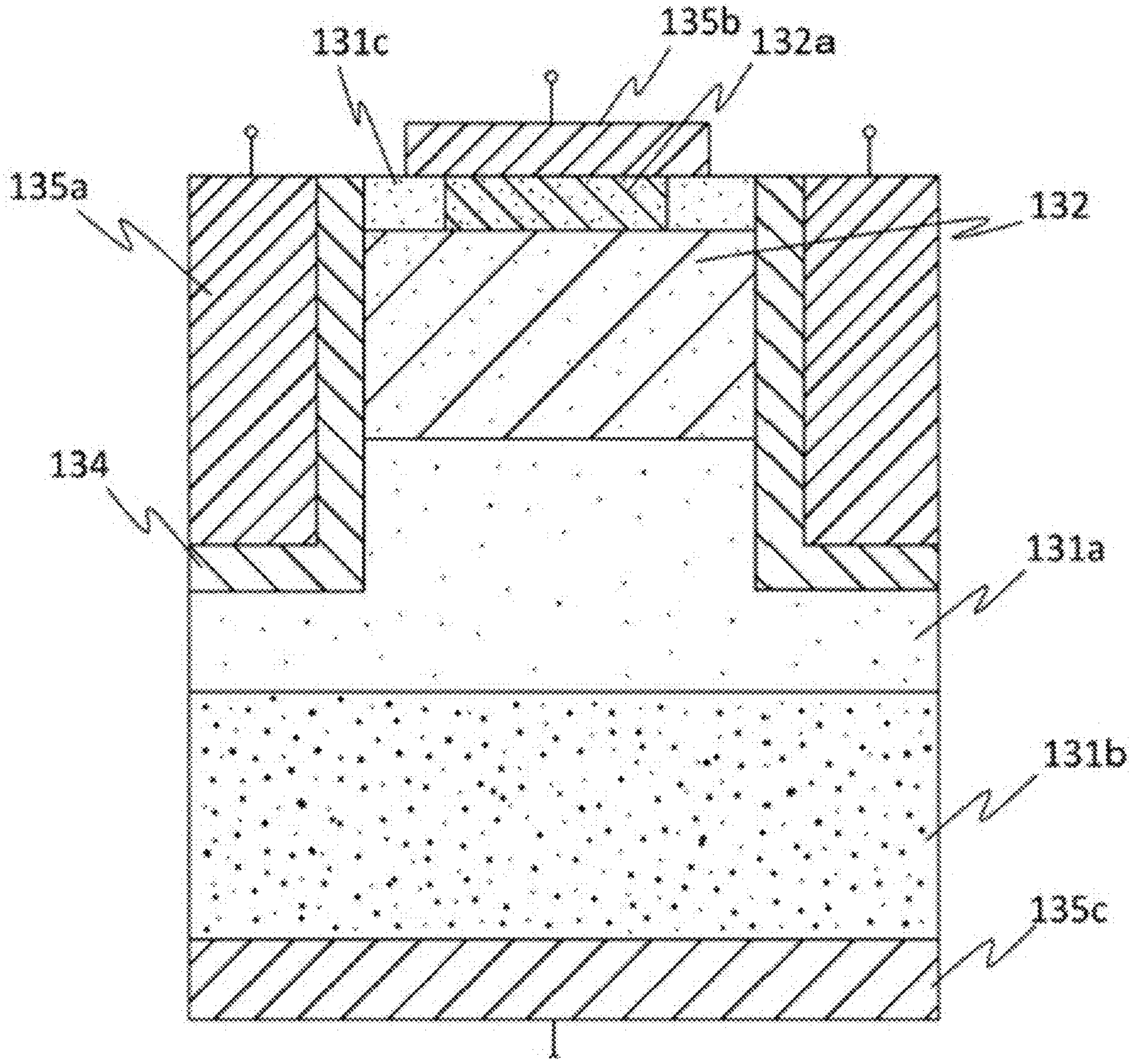
FIG. 9 is a diagram schematically illustrating a suitable example of a metal-oxide-semiconductor field-effect transistor (MOSFET).

FIG. 9 illustrates a suitable example of a metal-oxide-semiconductor field-effect transistor (MOSFET) including an n− type semiconductor layer 131*a*, a first n+ type semiconductor layer 131*b*, a second n+ type semiconductor layer 131*c*, a p type semiconductor layer 132, a p+ type semiconductor layer 132*a*, a gate insulation film 134, a gate electrode 135*a*, a source electrode 135*b*, and a drain electrode 135*c*. Note that, the p+ type semiconductor layer 132*a* may be a p type semiconductor layer and may be the same as the p type semiconductor layer 132.

(IGBT)

Figure 10:
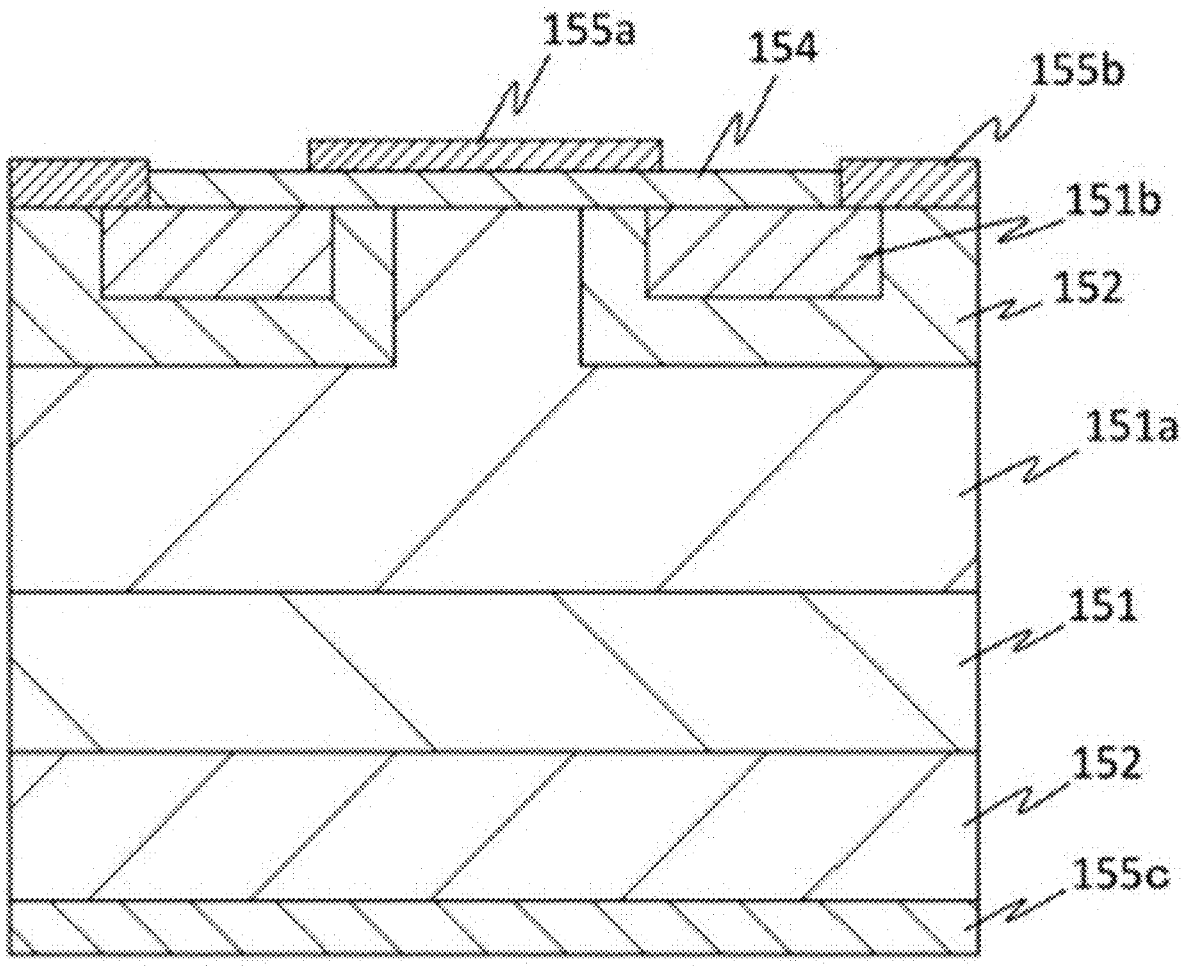
FIG. 10 is a diagram schematically illustrating a suitable example of an insulated-gate bipolar transistor (IGBT).

FIG. 10 illustrates a suitable example of an insulated-gate bipolar transistor (IGBT) including an n type semiconductor layer 151, an n− type semiconductor layer 151*a*, an n+ type semiconductor layer 151*b*, a p type semiconductor layer 152, a gate insulation film 154, a gate electrode 155*a*, an emitter electrode 155*b*, and a collector electrode 155*c*.

(LED)

Figure 11:
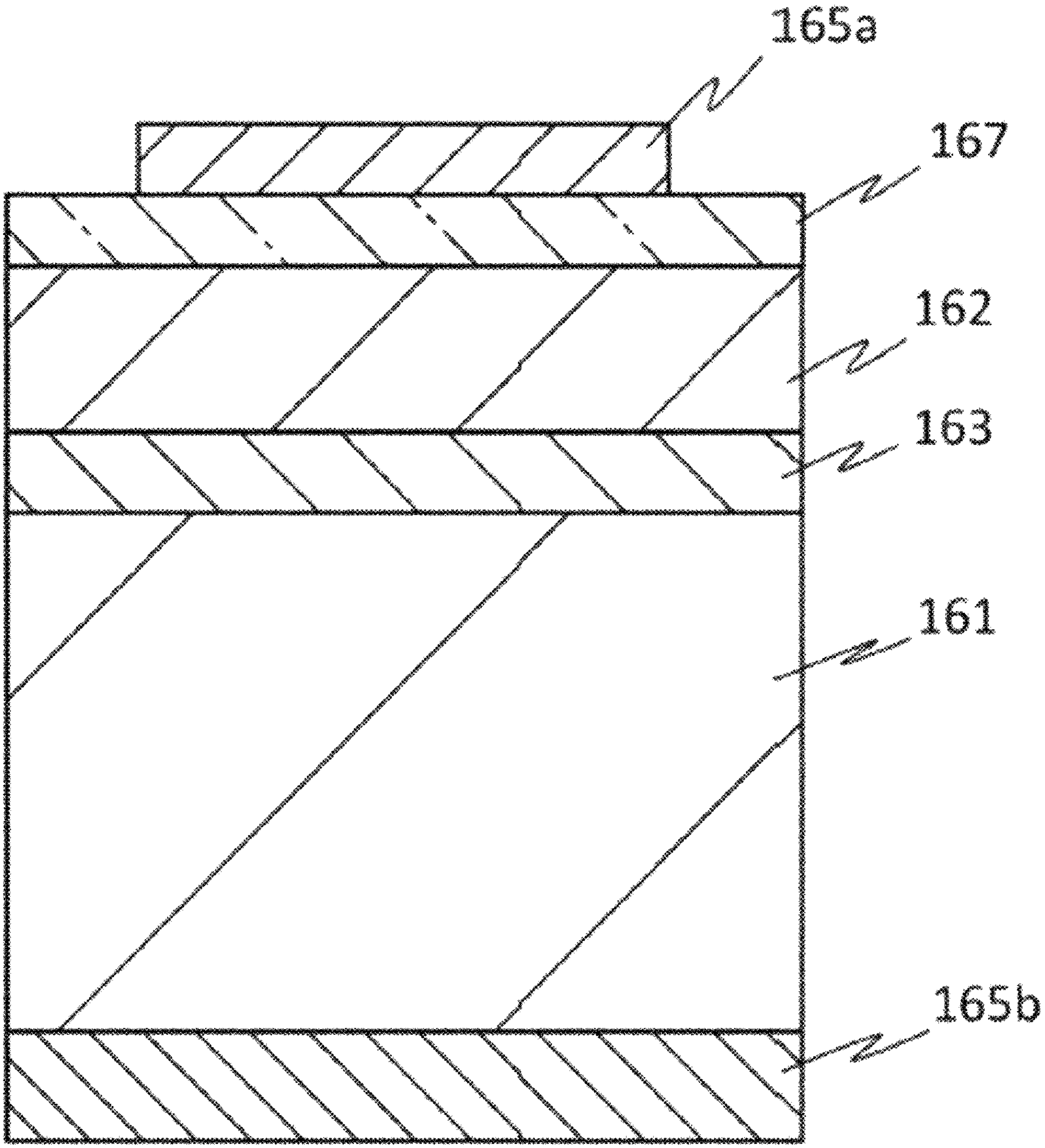
FIG. 11 is a diagram schematically illustrating a suitable example of a light-emitting diode (LED).

An example of a case where the semiconductor device according to an embodiment of the present disclosure is a light-emitting diode (LED) is illustrated in FIG. 11. The semiconductor light-emitting element in FIG. 11 includes an n type semiconductor layer 161 on a second electrode 165*b*, and a light-emitting layer 163 is layered on the n type semiconductor layer 161. Further, a p type semiconductor layer 162 is layered on the light-emitting layer 163. A light-transmitting electrode 167 that transmits light emitted by the light-emitting layer 163 is provided on the p type semiconductor layer 162, and a first electrode 165*a* is layered on the light-transmitting electrode 167. Note that, the semiconductor light-emitting element in FIG. 11 may be covered by a protective layer, excluding the electrode portions.

Examples of the material of the light-transmitting electrode include an electrically-conductive material made of an oxide such as indium (In) or titanium (Ti), and more specifically, $In_2O_3$, ZnO, $SnO_2$, $Ga_2O_3$, $TiO_2$, $CeO_2$, a mixed crystal of two or more of these, and a material doped with any of these. The light-transmitting electrode may be formed by providing these materials by sputtering or other known means. After forming the light-transmitting electrode, thermal annealing may be performed to make the light-transmitting electrode transparent.

According to the semiconductor light-emitting element in FIG. 11, the first electrode 165*a* is the positive electrode and the second electrode 165*b* is the negative electrode, and a current is passed through the p type semiconductor layer 162, the light-emitting layer 163 and the n type semiconductor layer 161 via the electrodes, thereby causing the light-emitting layer 163 to emit light.

Examples of the material of the first electrode 165*a* and the second electrode 165*b* include a metal such as Al, Mo, Co, Zr, Sn, Nb, Fe, Cr, Ta, Ti, Au, Pt, V, Mn, Ni, Cu, Hf, W, Ir, Zn, In, Pd, Nd or Ag or their alloys, metal oxide conductive films such as tin oxide, zinc oxide, indium oxide, indium tin oxide (ITO), and indium zinc oxide (IZO), and organic conductive compounds such as polyaniline, polythiophene, or polypyrrole, and mixtures thereof. The method of forming the electrodes is not particularly limited, and the electrodes may be formed on the base according to an appropriate method selected in consideration of suitability from among wet methods such as printing, spraying, and coating, physical methods such as vacuum deposition, sputtering, and ion plating, and chemical methods such as CVD and plasma CVD.

(Gas Sensor)

Figure 17:
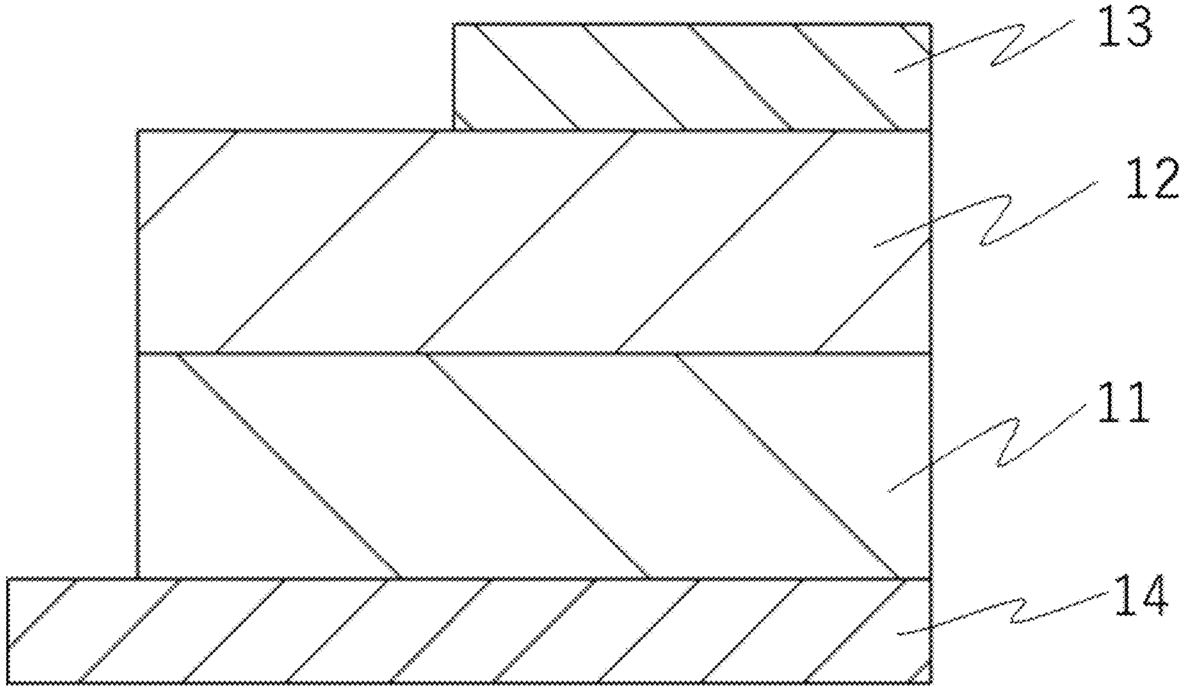
FIG. 17 is a diagram schematically illustrating a suitable example of a gas sensor.

FIG. 17 illustrates an example of a gas sensor according to an embodiment of the present disclosure. The gas sensor in FIG. 17 includes a first layer 11, a second layer 12, a first electrode 13, and a second electrode 14. The first layer and the second layer may be n type semiconductor layers or p type semiconductor layers. The working coefficient of the second layer is smaller than the working coefficient of the first later. The second layer and the first electrode preferably form a Schottky barrier. The first layer and the second electrode are preferably a Schottky barrier. The material of the first and second electrodes is not particularly limited. The material of the first and second electrodes may be gold, silver, or platinum, for example. A gas sensor having higher sensitivity may be formed by using the crystalline oxide film according to the present disclosure for the first layer and/or the second layer.

(Photoelectric Conversion Device)

Figure 18:
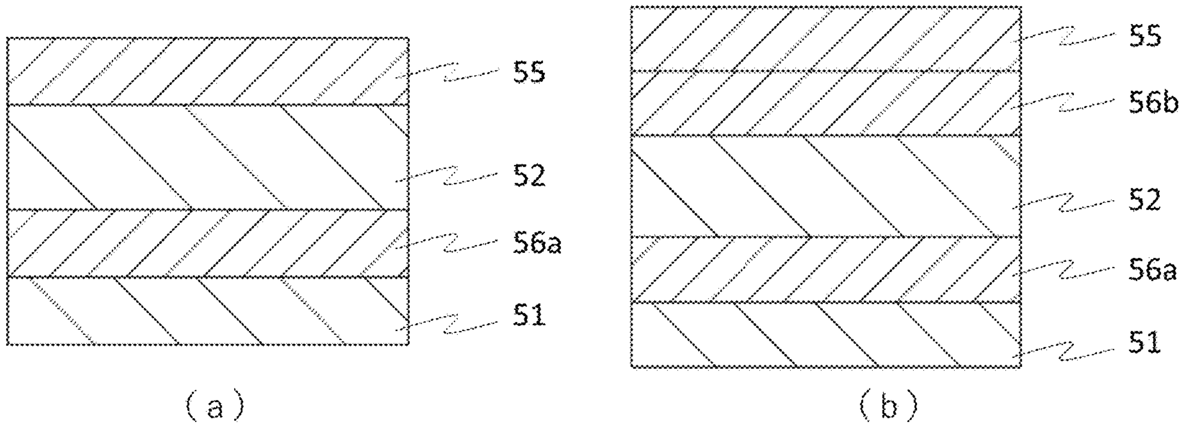
FIG. 18 is a diagram schematically illustrating a suitable example of a photoelectric transducer.

FIG. 18 illustrates an example of a photoelectric conversion device according to an embodiment of the present disclosure. The photoelectric conversion device in FIG. 18(*a*) has a structure in which an electrically-conductive film 51 that functions as a lower electrode, an electron blocking layer 56*a*, a photoelectric conversion layer 52, and a transparent conductive film 55 that functions as an upper electrode are layered in this order. The photoelectric conversion device in FIG. 18(*b*) has a structure in which the electron blocking layer 56*a*, the photoelectric conversion layer 52, an electron hole blocking layer 56*b*, and the upper electrode 55 are layered on the lower electrode 51 in this order. The order in which the electron blocking layer 56*a*, the photoelectric conversion layer 52, and the electron hole blocking layer 56*b* in FIG. 15(*a*) are layered may be changed as required according to different uses and characteristics. The crystalline oxide film according to the present disclosure may be used for, for example, the photoelectric conversion layer 52, the electron blocking layer 56*a*, or the electron hole blocking layer 56*b*. In the photoelectric conversion device in FIG. 18, light is preferably incident on the photoelectric conversion layer 52 via the upper electrode 55. Such a photoelectric conversion device may be suitably applied to optical sensor applications and imaging device applications.

(Light-Receiving Element)

Figure 19:
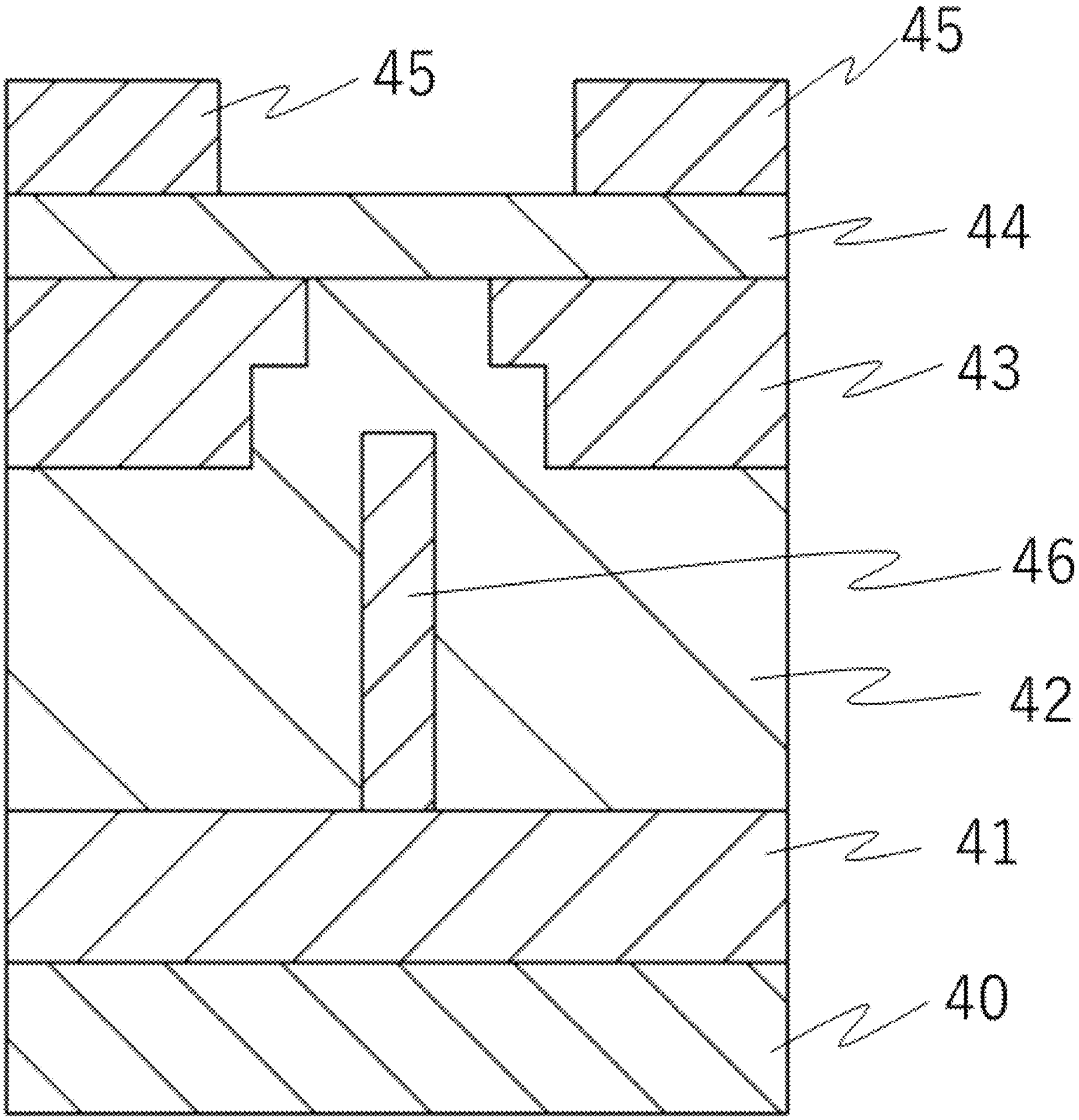
FIG. 19 is a diagram schematically illustrating a suitable example of a light-receiving element.

FIG. 19 illustrates an example of a light-receiving element according to an embodiment of the present disclosure. The light-receiving element in FIG. 19 includes a lower electrode 40, a high-concentration n type layer 41, a low-concentration n type layer 42, a high-concentration p type layer 43, a Schottky electrode 44, an upper electrode 45, and a specific region 46. The materials of the lower electrode 40, the Schottky electrode 44, and the upper electrode 45 may be known electrode materials (e.g., Au, Ni, Pb, Rh, Co, Re, Te, Ir, Pt, Se). The specific region 46 is, for example, a high-concentration n type region. In an embodiment of the present disclosure, the crystalline oxide film may be suitably used for the high-concentration n type layer 41, the low-concentration n type layer 42, the high-concentration p type layer 43, and the specific region 46. According to the light-receiving element in FIG. 19, when eye-safe band light is incident through a window portion of the upper electrode 45 and the light is absorbed by free electrons at the Schottky electrode 44, electrons are emitted to the low-concentration n type layer 42 side, and these emitted electrons may be accelerated in a high electric field region near a tip of the specified region 46.

(Photoelectrode)

Figure 20:
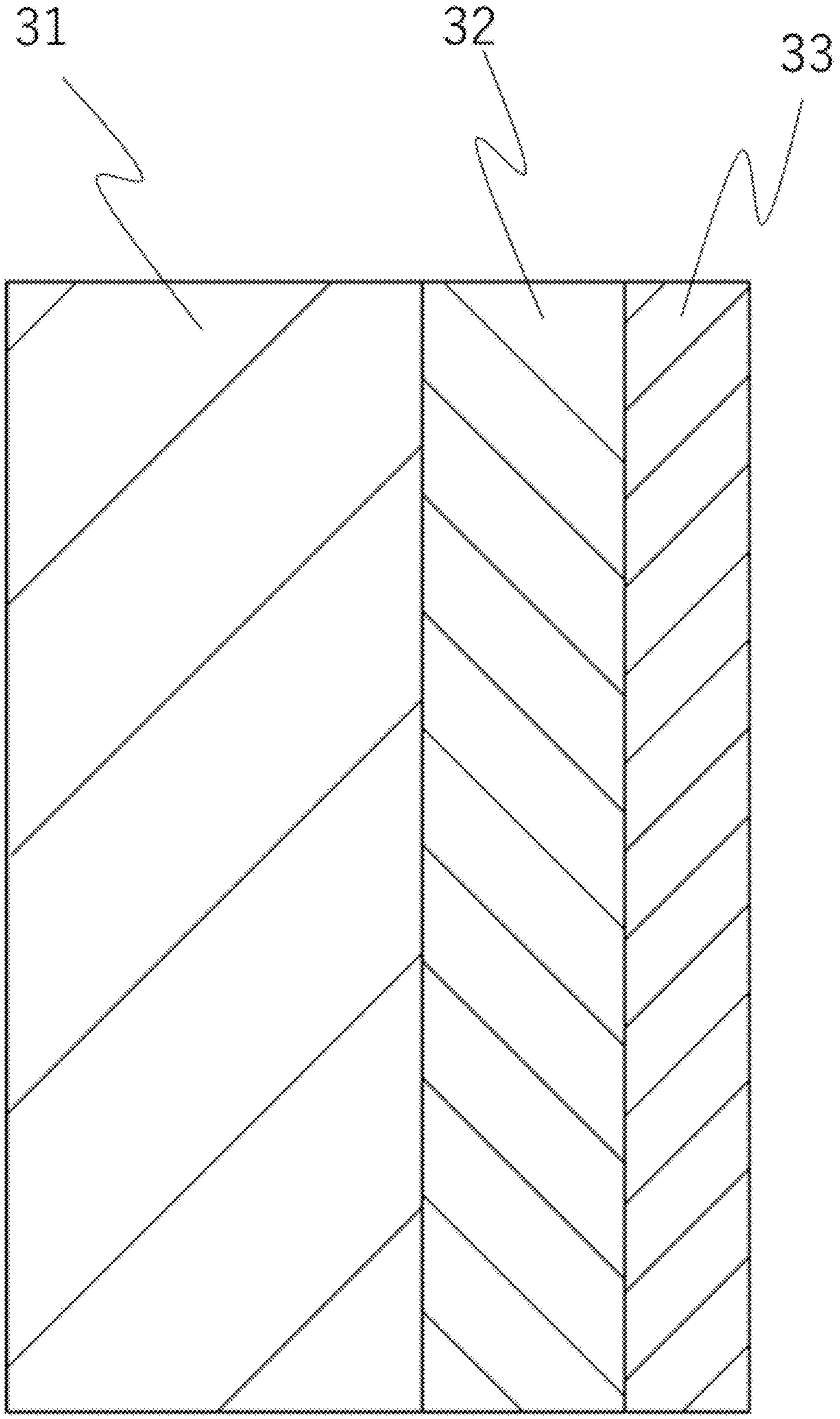
FIG. 20 is a diagram schematically illustrating a suitable example of a photoelectrode.

FIG. 20 illustrates an example of a photoelectrode according to an embodiment of the present disclosure. The photoelectrode in FIG. 20 includes a substrate 31, a conductor layer (electron conducting layer) 32 provided on the substrate 31, and a photocatalyst layer (light absorbing layer) 33 provided on the conductor layer 32. A glass substrate or a sapphire substrate, for example, may be used as the substrate 31. In an embodiment of the present disclosure, the crystal substrate described above, for example, may be used as the substrate 31. The thickness of the conductor layer 32 is not particularly limited, but 10 nm to 150 nm is preferred. The thickness of the photocatalyst layer 33 is not particularly limited, but 100 nm or more is preferred. In a case where the photocatalyst layer 33 is composed of an n type semiconductor, the combination of materials of the photocatalyst layer 33 and the conductor layer 32 is preferably determined such that the energy difference between the vacuum level and the Fermi level of the conductor layer 32 is smaller than the energy difference between the vacuum level and the Fermi level of the photocatalyst layer 33. In a case where the photocatalyst layer 33 is composed of a p type semiconductor, the combination of materials of the conductor layer 32 and the photocatalytic layer 33 is preferably determined such that the energy difference between the vacuum level and the Fermi level of the conductor layer 32 is greater than the energy difference between the vacuum level and the Fermi level of the photocatalyst layer 33. In an embodiment of the present disclosure, the crystalline oxide film may be suitably used for the conductor layer 32 and/or the photocatalyst layer 33. The photoelectrode in FIG. 20 is suitably used for photoelectrochemical cells, for example.

Figure 12:
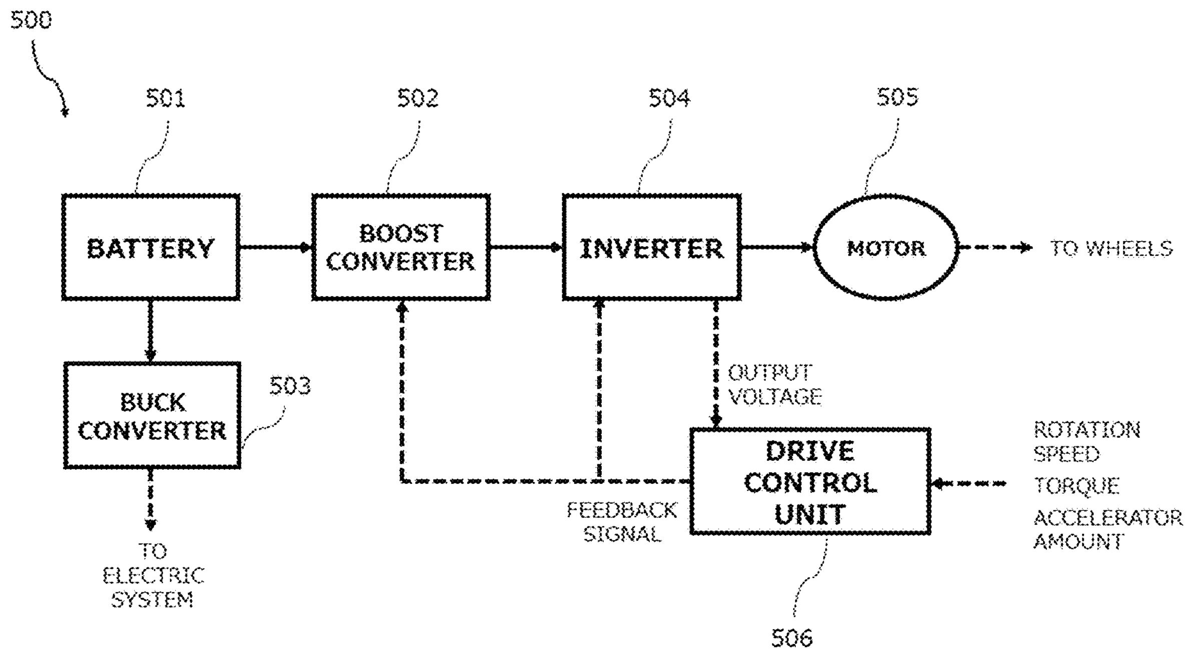
FIG. 12 is a block diagram illustrating an example of a control system applying the semiconductor device according to an embodiment of the disclosure.
Figure 13:
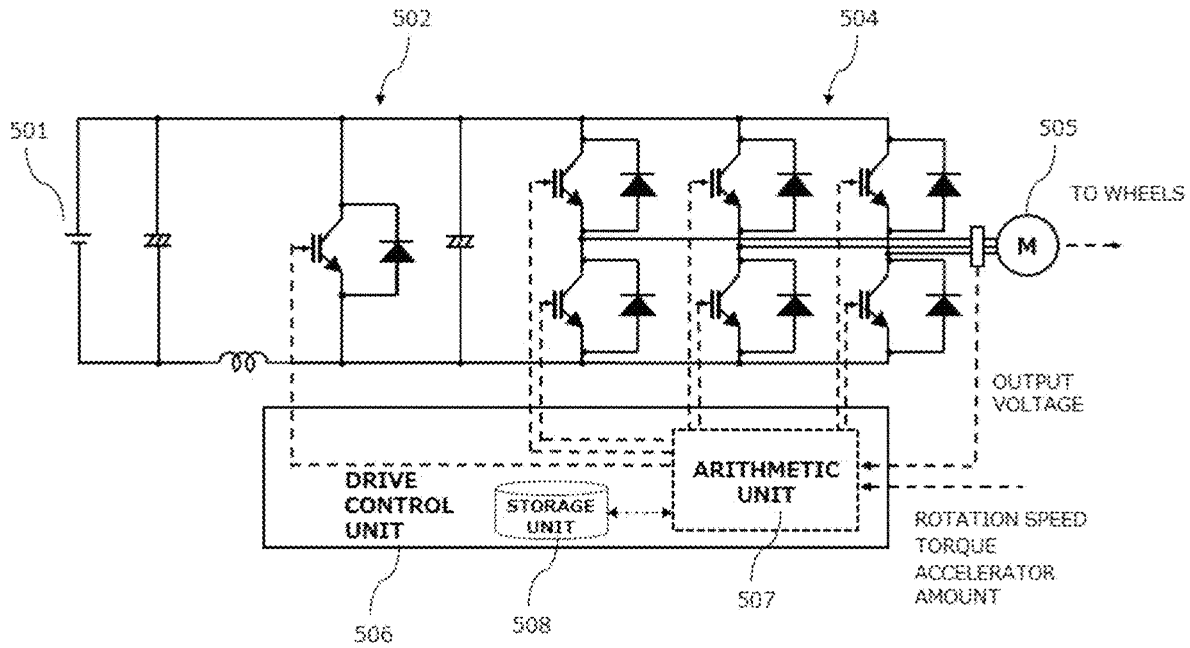
FIG. 13 is a circuit diagram illustrating an example of the control system applying the semiconductor device according to an embodiment of the disclosure.

In order to exhibit the functions described above, the crystalline oxide film, the oxide semiconductor and/or the semiconductor device of the disclosure described above can be applied to a power converter such as an inverter or a converter. More specifically, it can be applied as a diode incorporated in the inverter or converter, a thyristor, a power transistor, an IGBT (Insulated Gate Bipolar Transistor), a MOSFET (Metal-Oxide-Semiconductor Field Effect Transistor or the like as a switching element. FIG. 12 is a block diagram illustrating an exemplary control system applying a semiconductor device according to an embodiment of the disclosure, and FIG. 13 is a circuit diagram of the control system particularly suitable for applying to a control system of an electric vehicle.

As shown in FIG. 12, the control system 500 includes a battery (power supply) 501, a boost converter 502, a buck converter 503, an inverter 504, a motor (driving object) 505, a drive control unit 506, which are mounted on an electric vehicle. The battery 501 consists of, for example, a storage battery such as a nickel hydrogen battery or a lithium-ion battery. The battery 501 can store electric power by charging at the power supply station or regenerating at the time of deceleration, and to output a direct current (DC) voltage required for the operation of the driving system and the electrical system of the electric vehicle. The boost converter 502 is, for example, a voltage converter in which a chopper circuit is mounted, and can step-up DC voltage of, for example, 200V supplied from the battery 501 to, for example, 650V by switching operations of the chopper circuit. The step-up voltage can be supplied to a traveling system such as a motor. The buck converter 503 is also a voltage converter in which a chopper circuit is mounted, and can step-down DC voltage of, for example, 200V supplied from the battery 501 to, for example, about 12V. The step-down voltage can be supplied to an electric system including a power window, a power steering, or an electric device mounted on a vehicle.

The motor 505 is a three-phase AC motor constituting the traveling system of an electric vehicle, and is driven by an AC voltage of the three-phase output from the inverter 504. The rotational driving force is transmitted to the wheels of the electric vehicle via a transmission mechanism (not shown).

On the other hand, actual values such as rotation speed and torque of the wheels, the amount of depression of the accelerator pedal (accelerator amount) are measured from an electric vehicle in cruising by using various sensors (not shown), The signals thus measured are input to the drive control unit 506. The output voltage value of the inverter 504 is also input to the drive control unit 506 at the same time. The drive control unit 506 has a function of a controller including an arithmetic unit such as a CPU (Central Processing Unit) and a data storage unit such as a memory, and generates a control signal using the inputted measurement signal and outputs the control signal as a feedback signal to the inverters 504, thereby controlling the switching operation by the switching elements. The AC voltage supplied to the motor 505 from the inverter 504 is thus corrected instantaneously, and the driving control of the electric vehicle can be executed accurately. Safety and comfortable operation of the electric vehicle is thereby realized. In addition, it is also possible to control the output voltage to the inverter 504 by providing a feedback signal from the drive control unit 506 to the boost converter 502.

FIG. 13 is a circuit configuration excluding the buck converter 503 in FIG. 12, in other words, a circuit configuration showing a configuration only for driving the motor 505. As shown in the FIG. 13, the semiconductor device of the disclosure is provided for switching control by, for example, being applied to the boost controller 502 and the inverter 504 as a Schottky barrier diode. The boost converter 502 performs chopper control by incorporating the semiconductor device into the chopper circuit of the boost converter 502. Similarly, the inverter 504 performs switching control by incorporating the semiconductor device into the switching circuit including an IGBT of the inverter 504. The current can be stabilized by interposing an inductor (such as a coil) at the output of the battery 501. Also, the voltage can be stabilized by interposing a capacitor (such as an electrolytic capacitor) between each of the battery 501, the boost converter 502, and the inverter 504.

As indicated by a dotted line in FIG. 13, an arithmetic unit 507 including a CPU (Central Processing Unit) and a storage unit 508 including a nonvolatile memory are provided in the drive control unit 506. Signal input to the drive control unit 506 is given to the arithmetic unit 507, and a feedback signal for each semiconductor element is generated by performing the necessary operation. The storage unit 508 temporarily holds the calculation result by the calculation unit 507, stores physical constants and functions necessary for driving control in the form of a table, and outputs the physical constants, functions, and the like to the arithmetic unit 507 as appropriate. The arithmetic unit 507 and the storage unit 508 can be provided by a known configuration, and the processing capability and the like thereof can be arbitrarily selected.

As shown in FIGS. 12 and 13, a diode and a switching element such as a thyristor, a power transistor, an IGBT, a MOSFET and the like is employed for the switching operation of the boost converter 502, the buck converter 503 and the inverter 504 in the control system 500. Further, extremely outstanding switching performance can be expected and miniaturization and cost reduction of the control system 500 can be realized by applying a oxide semiconductor or a semiconductor device of the disclosure. That is, each of the boost converter 502, the buck converter 503 and the inverter 504 can be expected to have the benefit of the disclosure, and the effect and the advantages can be expected in any one or combination of the boost converter 502, the buck converter 503 and the inverter 504, or in any one of the boost converter 502, the buck converter 503 and the inverter 504 together with the drive control unit 506. The control system 500 described above is not only applicable to the control system of an electric vehicle of the semiconductor device of the disclosure, but can be applied to a control system for any applications such as to step-up and step-down the power from a DC power source, or convert the power from a DC to an AC. It is also possible to use a power source such as a solar cell as a battery.

Figure 14:
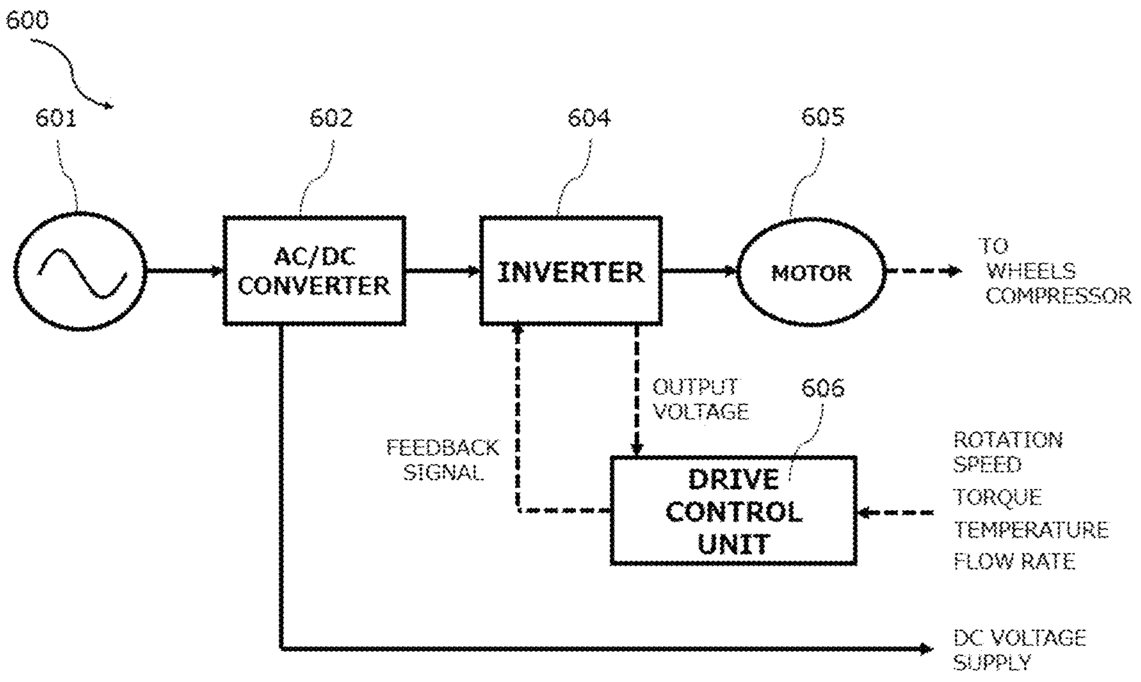
FIG. 14 is a block configuration diagram illustrating another example of the control system applying the semiconductor device according to an embodiment of the disclosure.
Figure 15:
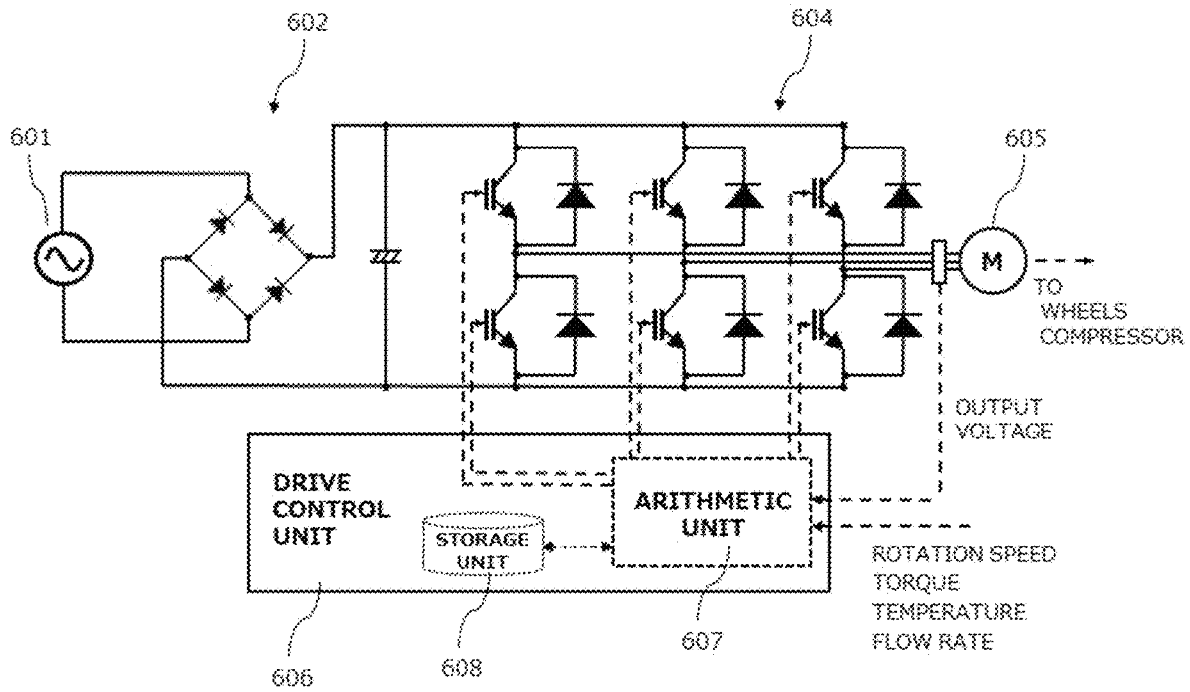
FIG. 15 is a circuit diagram illustrating another example of the control system applying the semiconductor device according to an embodiment of the disclosure.

FIG. 14 is a block diagram illustrating another exemplary control system applying a semiconductor device according to an embodiment of the disclosure, and FIG. 15 is a circuit diagram of the control system suitable for applying to infrastructure equipment and home appliances or the like operable by the power from the AC power source.

As shown in FIG. 14, the control system 600 is provided for inputting power supplied from an external, such as a three-phase AC power source (power supply) 601, and includes an AC/DC converter 602, an inverter 604, a motor (driving object) 605 and a drive control unit 606 that can be applied to various devices described later. The three-phase AC power supply 601 is, for example, a power plant (such as a thermal, hydraulic, geothermal, or nuclear plant) of an electric power company, whose output is supplied as an AC voltage while being downgraded through substations. Further, the three-phase AC power supply 601 is installed in a building or a neighboring facility in the form of a private power generator or the like for supplying the generated power via a power cable. The AC/DC converter 602 is a voltage converter for converting AC voltage to DC voltage. The AC/DC converter 602 converts AC voltage of 100V or 200V supplied from the three-phase AC power supply 601 to a predetermined DC voltage. Specifically, AC voltage is converted by a transformer to a desired, commonly used voltage such as 3. 3V, 5V, or 12V. When the driving object is a motor, conversion to 12V is performed. It is possible to adopt a single-phase AC power supply in place of the three-phase AC power supply. In this case, same system configuration can be realized if an AC/DC converter of the single-phase input is employed.

The inverter 604 converts the DC voltage supplied from the AC/DC converter 602 into three-phase AC voltage by switching operations and outputs to the motor 605. Configuration of the motor 605 is variable depending on the control object. It can be a wheel if the control object is a train, can be a pump and various power source if the control objects a factory equipment, can be a three-phase AC motor for driving a compressor or the like if the control object is a home appliance. The motor 605 is driven to rotate by the three-phase AC voltage output from the inverter 604, and transmits the rotational driving force to the driving object (not shown).

There are many kinds of driving objects such as personal computer, LED lighting equipment, video equipment, audio equipment and the like capable of directly supplying a DC voltage output from the AC/DC inverter 602. In that case the inverter 604 becomes unnecessary in the control system 600, and a DC voltage from the AC/DC inverter 602 is supplied to the driving object directly as shown in FIG. 14. Here, DC voltage of 3. 3V is supplied to personal computers and DC voltage of 5V is supplied to the LED lighting device for example.

On the other hand, rotation speed and torque of the driving object, measured values such as the temperature and flow rate of the peripheral environment of the driving object, for example, is measured using various sensors (not shown), these measured signals are input to the drive control unit 606. At the same time, the output voltage value of the inverter 604 is also input to the drive control unit 606. Based on these measured signals, the drive control unit 606 provides a feedback signal to the inverter 604 thereby controls switching operations by the switching element of the inverter 604. The AC voltage supplied to the motor 605 from the inverter 604 is thus corrected instantaneously, and the operation control of the driving object can be executed accurately. Stable operation of the driving object is thereby realized. In addition, when the driving object can be driven by a DC voltage, as described above, feedback control of the AC/DC controller 602 is possible in place of feedback control of the inverter.

FIG. 15 shows the circuit configuration of FIG. 14. As shown in FIG. 15, the semiconductor device of the disclosure is provided for switching control by, for example, being applied to the AC/DC converter 602 and the inverter 604 as a Schottky barrier diode. The AC/DC converter 602 has, for example, a circuit configuration in which Schottky barrier diodes are arranged in a bridge-shaped, to perform a direct-current conversion by converting and rectifying the negative component of the input voltage to a positive voltage. Schottky barrier diodes can also be applied to a switching circuit in IGBT of the inverter 604 to perform switching control. The current can be stabilized by interposing an inductor (such as a coil) between the three-phase AC power supply 601 and the AC/DC converter 602. The voltage can be stabilized by interposing a capacitor (such as an electrolytic capacitor) between the AC/DC converter 602 and the inverter 604.

As indicated by a dotted line in FIG. 15, an arithmetic unit 607 including a CPU and a storage unit 608 including a nonvolatile memory are provided in the drive control unit 606. Signal input to the drive control unit 606 is given to the arithmetic unit 607, and a feedback signal for each semiconductor element is generated by performing the necessary operation. The storage unit 608 temporarily holds the calculation result by the arithmetic unit 607, stores physical constants and functions necessary for driving control in the form of a table, and outputs the physical constants, functions, and the like to the arithmetic unit 607 as appropriate. The arithmetic unit 607 and the storage unit 608 can be provided by a known configuration, and the processing capability and the like thereof can be arbitrarily selected.

In such a control system 600, similarly to the control system 500 shown in FIGS. 14 and 15, a diode or a switching element such as a thyristor, a power transistor, an IGBT, a MOSFET or the like is also applied for the purpose of the rectification operation and switching operation of the AC/DC converter 602 and the inverter 604. Further, extremely outstanding switching performance can be expected and miniaturization and cost reduction of the control system 600 can be realized by applying a semiconductor film or a semiconductor device of the disclosure. That is, each of the AC/DC converter 602 and the inverter 604 can be expected to have the benefit of the disclosure, and the effects and the advantages of the disclosure can be expected in any one or combination of the AC/DC converter 602 and the inverter 604, or in any of the AC/DC converter 602 and the inverter 604 together with the drive control unit 606.

Although the motor 605 has been exemplified in FIGS. 14 and 15, the driving object is not necessarily limited to those that operate mechanically. Many devices that require an AC voltage can be a driving object. It is possible to apply the control system 600 as long as electric power is obtained from AC power source to drive the driving object. The control system 600 can be applied to the driving control of any electric equipment such as infrastructure equipment (electric power facilities such as buildings and factories, telecommunication facilities, traffic control facilities, water and sewage treatment facilities, system equipment, labor-saving equipment, trains and the like) and home appliances (refrigerators, washing machines, personal computers, LED lighting equipment, video equipment, audio equipment and the like).

Example 1

1. Film Forming Device

A mist CVD device used in the present example will be described with reference to FIG. 1. A mist CVD device 19 includes a susceptor 21 on which the substrate 20 is placed, a carrier gas supply means **22*a* that supplies a carrier gas, a flow rate control valve 23*a* that controls the flow rate of the carrier gas emitted from the carrier gas supply means 22*a*, a carrier gas (diluted) supply means 22*b* that supplies a carrier gas (diluted), a flow rate control valve 23*b* that controls the flow rate of the carrier gas emitted from the carrier gas (diluted) supply means 22***b*, a mist generation source 24 accommodating a raw material solution 24*a*, a vessel 25 configured to hold a water 25*a*, an ultrasonic transducer 26 attached to a bottom surface of the vessel 25, a supply tube 27 made of a quartz tube with a diameter of 40 mm, and a heater 28 installed in the vicinity of the supply tube 27.

The susceptor 21 is made of quartz and the surface of the susceptor 21 on which the substrate 20 is placed is inclined relative to a horizontal plane. The supply tube 27 and the susceptor 21, which serve as the deposition chamber, are both fabricated from quartz to help prevent the introduction of equipment-derived impurities into the film to be formed on the substrate 20.

2. Preparing Raw Material Solution

The raw material solution 24*a* was prepared by adding 10 volume percent of hydrochloric acid (HCl) to an aqueous solution of 0.001 M bis[2-carboxyethylgermanium(IV)]sesquioxide ($C_6H_{10}Ge_2O_7$).

3. Film Formation Preparation

The raw material solution 24*a* obtained in [2. Preparing Raw Material Solution] described above was placed in the mist generation source 24. Subsequently, a (001) surface r-$TiO_2$ substrate serving as the crystal substrate 20 was placed on the susceptor 21 and the temperature of the heater 28 was raised to 750° C. Subsequently, the flow rate control valves 23*a* and 23*b* were opened to supply the carrier gas from the carrier gas supply means 22*a* and 22*b*, which are the carrier gas sources, into the supply tube 27. After the atmosphere in the supply tube 27 was sufficiently replaced with the carrier gas, the flow rate of the carrier gas and the carrier gas (diluted) were set to 3.0 L/min and 0.5 L/min, respectively. Note that, oxygen was used as the carrier gas.

4. Film Formation

Subsequently, the ultrasonic transducer 26 was oscillated at 2.4 MHz, and this oscillation was transmitted to the raw material solution 24*a* via the water 25*a* to atomize the raw material solution 24*a* and create a mist (atomized droplets) 24*b*. The mist 24*b* was passed through the supply tube 27 by the carrier gas and introduced into the film forming chamber 30, where the mist was made to thermally react on the substrate 20 at 725° C. under atmospheric pressure to form a $GeO_2$ film on the substrate 20. The film thickness of the obtained $GeO_2$ film was 200 nm.

5. Evaluation

Figure 2:
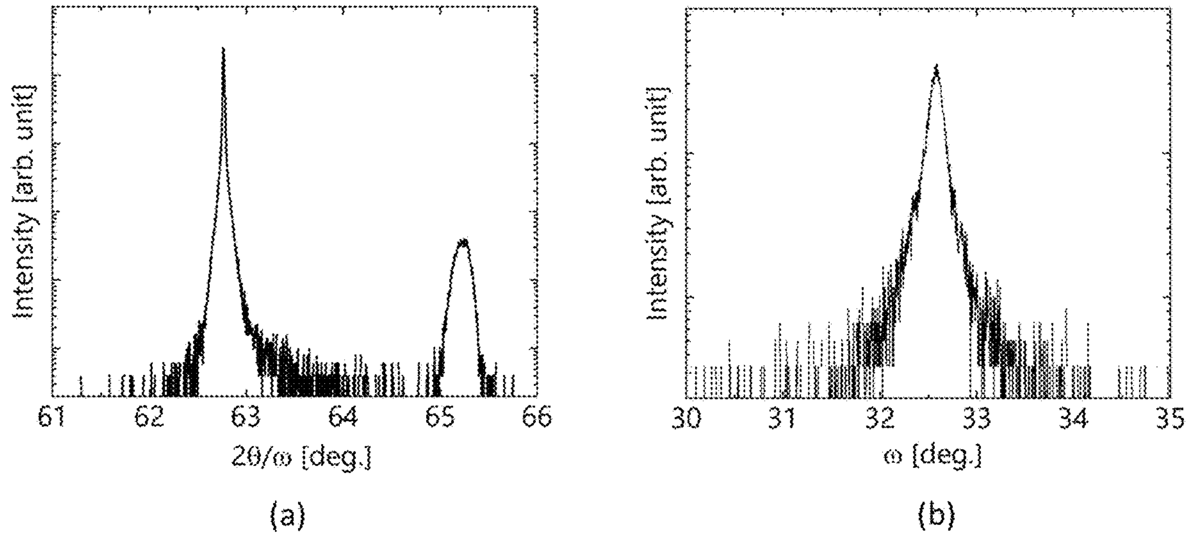
FIG. 2 is a graph showing measurement results of an X-ray diffractometer (XRD) according to an example.
Figure 3:
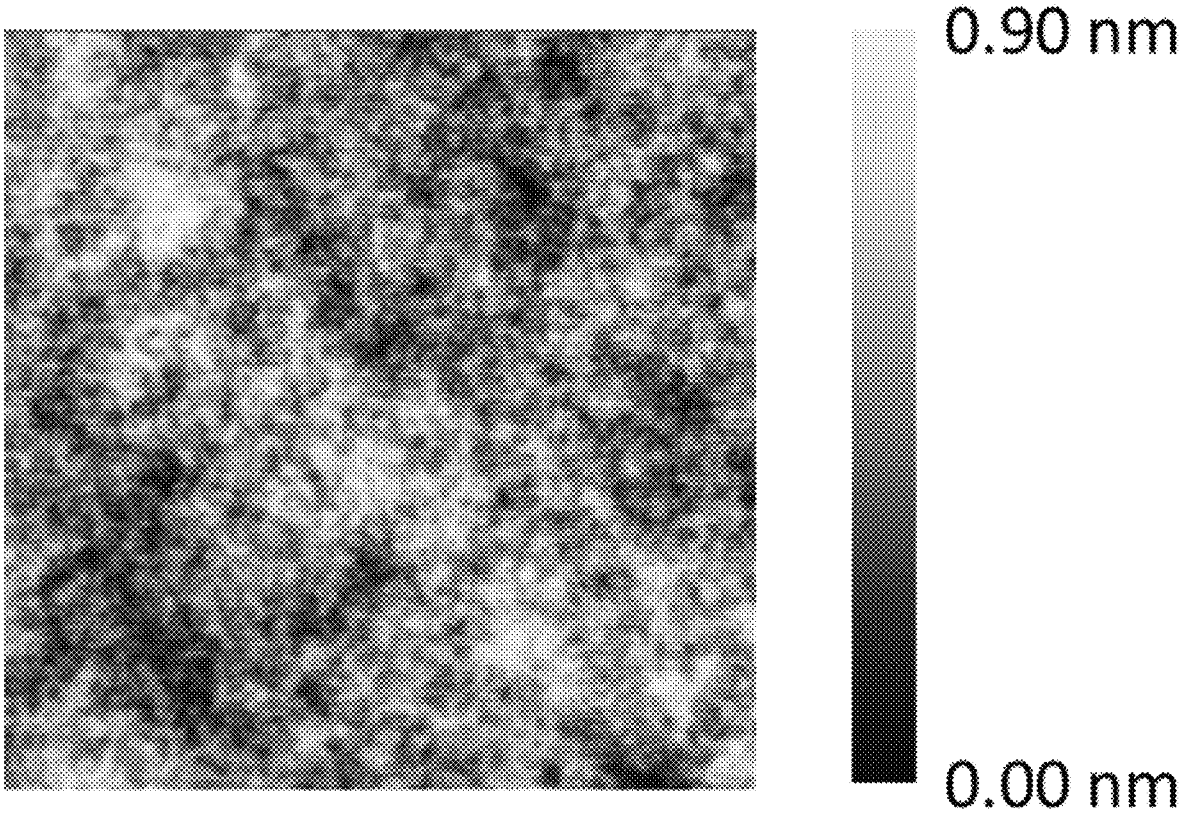
FIG. 3 is a graph showing surface observation results of an atomic force microscope (AFM) according to an example.
Figure 4:
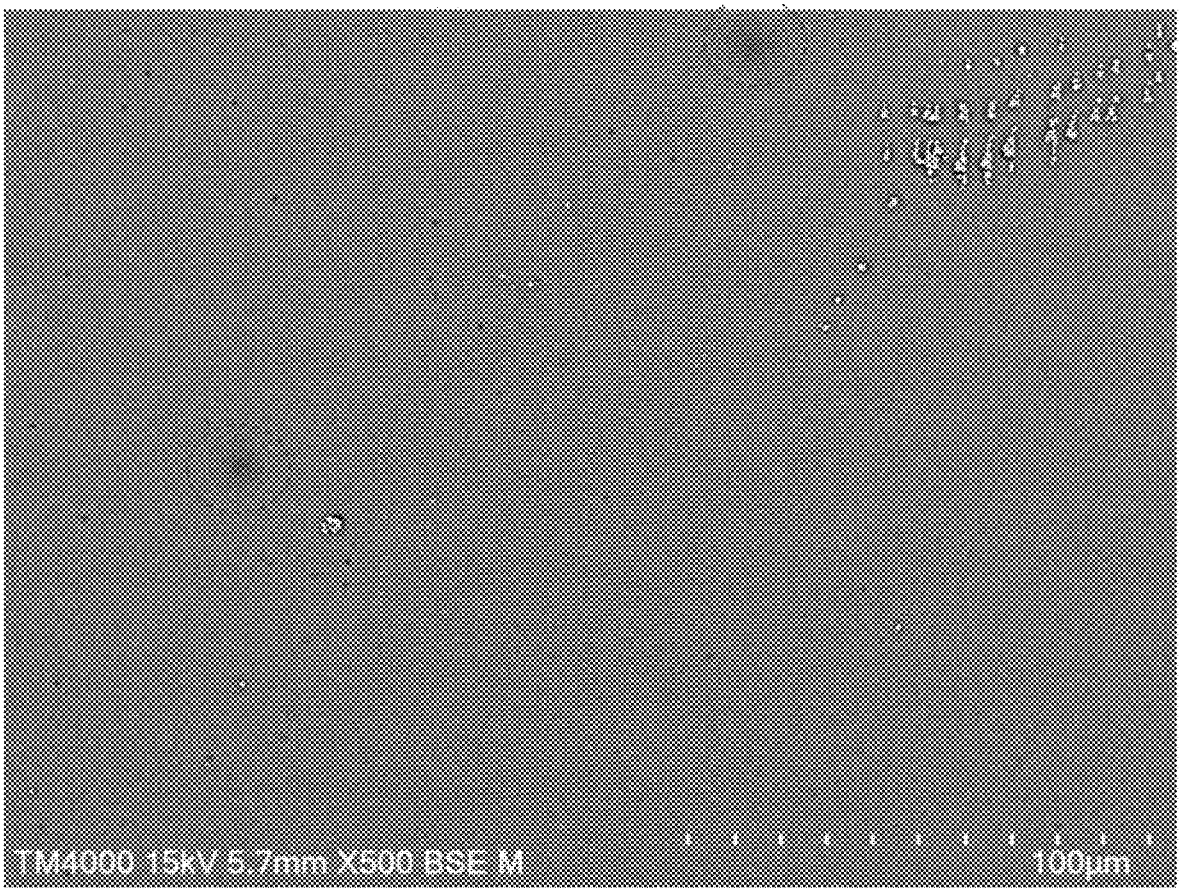
FIG. 4 is a graph showing surface observation results of a scanning electron microscope (SEM) according to an example.

The $GeO_2$ film of the crystalline multilayer structure obtained in [4. Film Formation] described above was identified using an X-ray diffractometer, and the resulting film was a (001) plane-oriented r-$GeO_2$ film with a rutile-type structure. The results of the XRD are shown in FIG. 2. FIG. 2(*a*) shows the results of a 2θ/ω scan and FIG. 2(*b*) shows the results of a ω scan. The rocking curve full width at half maximum at the 002 diffraction peak was 560 arcsec. The film surface was observed using an atomic force microscope (AFM). As shown in FIG. 3, the surface roughness (RMS) was 0.138 nm, indicating excellent surface smoothness. Further, the surface of the obtained film was observed using a scanning electron microscope (SEM), and the results are shown in FIG. 4. The dotted line in FIG. 4 indicates abnormal grains (areas where the height differs from a flat area). From the observation results shown in FIG. 4, the area percentage of abnormal grains (area of abnormal grain portion/area of the entire observation field of view) was calculated to be 0.8%.

Comparative Example 1

Figure 5:
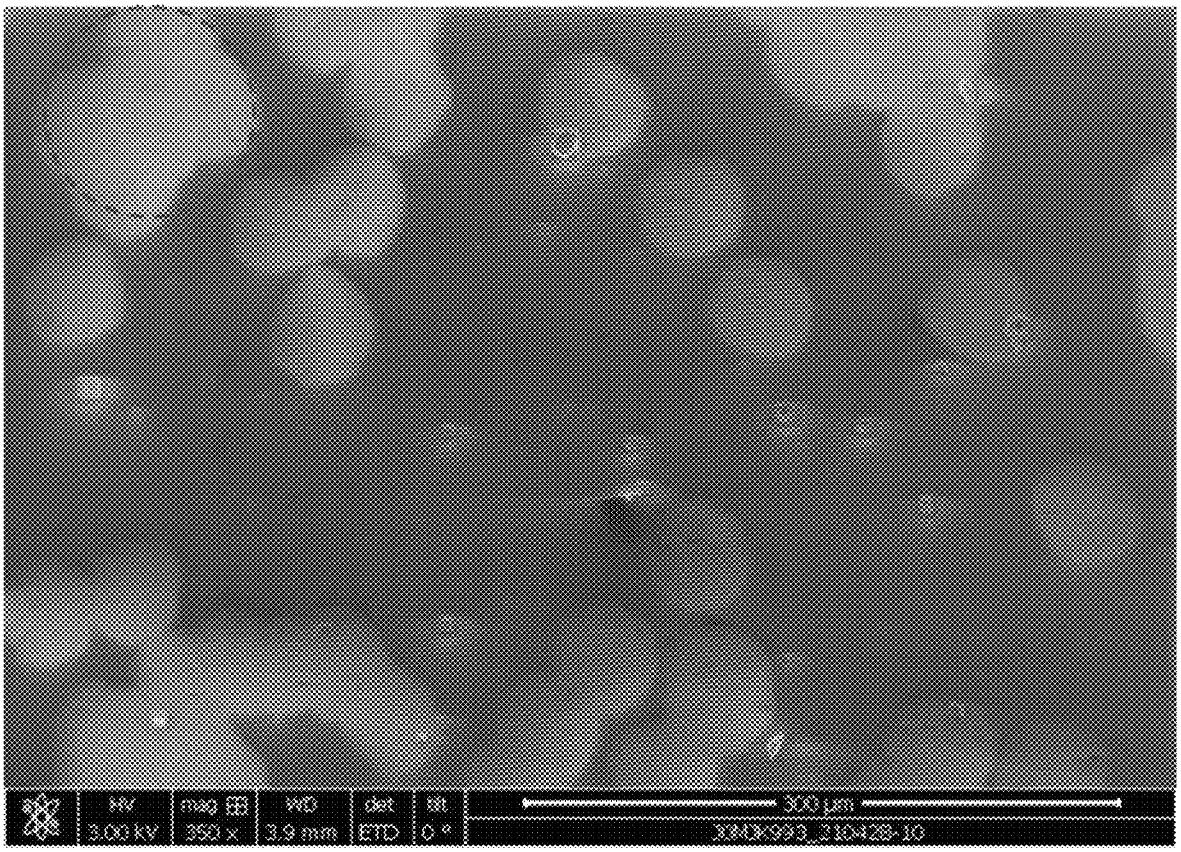
FIG. 5 is a graph showing surface observation results of a scanning electron microscope (SEM) according to a comparative example.

A $GeO_2$ film was formed in the same manner as in Example 1, except that the concentration of bis[2-carboxyethylgermanium(IV)]sesquioxide ($C_6H_{10}Ge_2O_7$) in the raw material solution was changed to 0.025 M (mol/L) and the film formation temperature was changed to 750° C. The obtained $GeO_2$ film was identified using an X-ray diffractometer, and it was found that the resulting film was a (001) plane-oriented r-$GeO_2$ film with a rutile-type structure. The results of observation of the obtained film surface using an SEM are shown in FIG. 5. From the observation results shown in FIG. 5, the area percentage of abnormal grains (area of abnormal grain portion/area of the entire observation field of view) was calculated to be 27%.

INDUSTRIAL APPLICABILITY

The crystalline oxide film according to the present disclosure may be used in all fields, including semiconductors (e.g., compound semiconductor electronic devices, etc.), electronic and electrical components, optical and electrophotographic devices, and industrial components, but are particularly useful in semiconductor devices and components thereof.

The embodiments of the present invention are exemplified in all respects, and the scope of the present invention includes all modifications within the meaning and scope equivalent to the scope of claims.

REFERENCE SIGNS LIST

1 p type semiconductor layer
2 Schottky electrode
3 n− type semiconductor layer
4 n+ type semiconductor layer
5 Ohmic electrode
11 First layer
12 Second layer
13 First electrode
14 Second electrode
19 Mist CVD device
20 Substrate (crystal substrate)
21 Susceptor
22*a* Carrier gas supply means
22*b* Carrier gas (diluted) supply means
23*a* Flow rate control valve
23*b* Flow rate control valve
24 Mist generation source
24*a* Raw material solution
25 Vessel
25*a* Water
26 Ultrasonic transducer
27 Supply tube
28 Heater
29 Exhaust port
31 Substrate
32 Conductor layer (electron conducting layer)
33 Photocatalyst layer (light absorbing layer)
40 Lower electrode
41 High-concentration n type layer
42 Low-concentration n type layer
43 High-concentration p type layer
44 Schottky electrode
45 Upper electrode
46 Specific region
51 Electrically-conductive film
52 Photoelectric conversion layer
55 Transparent conductive film
56*a* Electron blocking layer
56*b* Electron hole blocking layer

101*a* n− type semiconductor layer
101*b* n+ type semiconductor layer
105*b* Ohmic electrode
105*a* Schottky electrode 131*a* n− type semiconductor layer
131*b* First n+ type semiconductor layer
131*c* Second n+ type semiconductor layer
132 p type semiconductor layer
132*a* p+ type semiconductor layer
134 Gate insulating film
135*a* Gate electrode
135*b* Source electrode
135*c* Drain electrode
151 n type semiconductor layer
151*a* n− type semiconductor layer
151*b* n+ type semiconductor layer
152 p type semiconductor layer
154 Gate insulating film
155*a* Gate electrode
155*b* Emitter electrode
155*c* Collector electrode
161 n type semiconductor layer
162 p type semiconductor layer
163 Light-emitting layer
165*a* First electrode
165*b* Second electrode
167 Light-transmitting electrode

What is claimed is:

1. A crystalline oxide film comprising an oxide of germanium, an area percentage of abnormal grains determined by surface SEM observation being 3% or less.

2. The crystalline oxide film according to claim 1, wherein the crystalline oxide film has a film thickness of 100 nm or more.

3. The crystalline oxide film according to claim 1, wherein a region in which the area percentage of the abnormal grains determined by surface SEM observation is 3% or less exists over an area of at least 0.04 $mm^2$.

4. The crystalline oxide film according to claim 1, wherein the crystalline oxide film has a surface roughness of 10 nm or less.

5. The crystalline oxide film according to claim 1, wherein the crystalline oxide film has a tetragonal crystal structure.

6. The crystalline oxide film according to claim 1, wherein the crystalline oxide film is a uniaxially oriented film.

7. The crystalline oxide film according to claim 1, wherein the crystalline oxide film has a full width at half maximum determined by X-ray diffraction measurement of 1000 arcsec or less.

8. A semiconductor device comprising at least a crystalline oxide film and an electrode, the crystalline oxide film being the crystalline oxide film described in claim 1.

9. A power conversion device using the semiconductor device described in claim 8.

10. A control system using the semiconductor device described in claim 8.

* * * * *